United States Patent
Fitzpatrick et al.

(10) Patent No.: US 9,298,608 B2
(45) Date of Patent: Mar. 29, 2016

(54) BIASING FOR WEAR LEVELING IN STORAGE SYSTEMS

(71) Applicant: SanDisk Enterprise IP LLC, Milpitas, CA (US)

(72) Inventors: James Fitzpatrick, Sudbury, MA (US); James Higgins, Chandler, AZ (US)

(73) Assignee: SANDISK ENTERPRISE IP LLC, Milpitas, CA (US)

(*) Notice: Subject to any disclaimer, the term of this patent is extended or adjusted under 35 U.S.C. 154(b) by 157 days.

(21) Appl. No.: 14/137,440

(22) Filed: Dec. 20, 2013

(65) Prior Publication Data

US 2015/0113206 A1    Apr. 23, 2015

Related U.S. Application Data

(60) Provisional application No. 61/893,102, filed on Oct. 18, 2013.

(51) Int. Cl.
| | |
|---|---|
| *G06F 12/00* | (2006.01) |
| *G11C 16/00* | (2006.01) |
| *G06F 12/02* | (2006.01) |
| *G11C 16/34* | (2006.01) |

(52) U.S. Cl.
CPC ........ *G06F 12/0246* (2013.01); *G11C 16/3495* (2013.01)

(58) Field of Classification Search
CPC ............... G06F 12/0246; G06F 2212/7204; G06F 2212/7205; G11C 16/349
See application file for complete search history.

(56) References Cited

U.S. PATENT DOCUMENTS

| | | |
|---|---|---|
| 4,173,737 A | 11/1979 | Skerlos et al. |
| 4,888,750 A | 12/1989 | Kryder et al. |
| 4,916,652 A | 4/1990 | Schwarz et al. |

(Continued)

FOREIGN PATENT DOCUMENTS

| | | |
|---|---|---|
| EP | 1 299 800 | 4/2003 |
| EP | 1465203 A1 | 10/2004 |

(Continued)

OTHER PUBLICATIONS

Bayer, "Prefix B-Trees", IP.COM Journal, IP.COM Inc., West Henrietta, NY, Mar. 30, 2007, 29 pages.

(Continued)

*Primary Examiner* — Edward Dudek, Jr.
(74) *Attorney, Agent, or Firm* — Morgan, Lewis & Bockius LLP

(57) ABSTRACT

The various implementations described herein include systems, methods and/or devices used to enable biasing for wear leveling in storage systems. In one aspect, the method includes (1) determining, for each erase unit of a plurality of erase units in the storage medium, an age metric, (2) determining a representative age metric of the plurality of erase units, (3) for each respective erase unit of the plurality of erase units, biasing a respective garbage collection control metric for the respective erase unit in accordance with the age metric of the respective erase unit in relation to the representative age metric of the plurality of erase units to generate an adjusted garbage collection control metric for the respective erase unit, and (4) performing garbage collection for the storage medium in accordance with the adjusted garbage collection control metrics of the plurality of erase units.

20 Claims, 8 Drawing Sheets

(56) References Cited

U.S. PATENT DOCUMENTS

| | | |
|---|---|---|
| 5,129,089 A | 7/1992 | Nielsen |
| 5,270,979 A | 12/1993 | Harari et al. |
| 5,329,491 A | 7/1994 | Brown et al. |
| 5,381,528 A | 1/1995 | Brunelle |
| 5,519,847 A | 5/1996 | Fandrich et al. |
| 5,530,705 A | 6/1996 | Malone, Sr. |
| 5,537,555 A | 7/1996 | Landry et al. |
| 5,551,003 A | 8/1996 | Mattson et al. |
| 5,636,342 A | 6/1997 | Jeffries |
| 5,657,332 A | 8/1997 | Auclair et al. |
| 5,666,114 A | 9/1997 | Brodie et al. |
| 5,708,849 A | 1/1998 | Coke et al. |
| 5,765,185 A | 6/1998 | Lambrache et al. |
| 5,890,193 A | 3/1999 | Chevallier |
| 5,936,884 A | 8/1999 | Hasbun et al. |
| 5,943,692 A | 8/1999 | Marberg et al. |
| 5,982,664 A | 11/1999 | Watanabe |
| 6,000,006 A | 12/1999 | Bruce et al. |
| 6,006,345 A | 12/1999 | Berry, Jr. |
| 6,016,560 A | 1/2000 | Wada et al. |
| 6,018,304 A | 1/2000 | Bessios |
| 6,044,472 A | 3/2000 | Crohas |
| 6,070,074 A | 5/2000 | Perahia et al. |
| 6,119,250 A | 9/2000 | Nishimura et al. |
| 6,138,261 A | 10/2000 | Wilcoxson et al. |
| 6,182,264 B1 | 1/2001 | Ott |
| 6,192,092 B1 | 2/2001 | Dizon et al. |
| 6,295,592 B1 | 9/2001 | Jeddeloh |
| 6,311,263 B1 | 10/2001 | Barlow et al. |
| 6,408,394 B1 | 6/2002 | Vander Kamp et al. |
| 6,412,042 B1 | 6/2002 | Paterson et al. |
| 6,442,076 B1 | 8/2002 | Roohparvar |
| 6,449,625 B1 | 9/2002 | Wang |
| 6,484,224 B1 | 11/2002 | Robins et al. |
| 6,516,437 B1 | 2/2003 | Van Stralen et al. |
| 6,564,285 B1 | 5/2003 | Mills et al. |
| 6,678,788 B1 | 1/2004 | O'Connell |
| 6,757,768 B1 | 6/2004 | Potter et al. |
| 6,775,792 B2 | 8/2004 | Ulrich et al. |
| 6,810,440 B2 | 10/2004 | Micalizzi, Jr. et al. |
| 6,836,808 B2 | 12/2004 | Bunce et al. |
| 6,836,815 B1 | 12/2004 | Purcell et al. |
| 6,842,436 B2 | 1/2005 | Moeller |
| 6,865,650 B1 | 3/2005 | Morley et al. |
| 6,871,257 B2 | 3/2005 | Conley et al. |
| 6,895,464 B2 | 5/2005 | Chow et al. |
| 6,966,006 B2 | 11/2005 | Pacheco et al. |
| 6,978,343 B1 | 12/2005 | Ichiriu |
| 6,980,985 B1 | 12/2005 | Amer-Yahia et al. |
| 6,981,205 B2 | 12/2005 | Fukushima et al. |
| 6,988,171 B2 | 1/2006 | Beardsley et al. |
| 7,020,017 B2 | 3/2006 | Chen et al. |
| 7,028,165 B2 | 4/2006 | Roth et al. |
| 7,032,123 B2 | 4/2006 | Kane et al. |
| 7,043,505 B1 | 5/2006 | Teague et al. |
| 7,076,598 B2 | 7/2006 | Wang |
| 7,100,002 B2 | 8/2006 | Shrader |
| 7,102,860 B2 | 9/2006 | Wenzel |
| 7,111,293 B1 | 9/2006 | Hersh et al. |
| 7,126,873 B2 | 10/2006 | See et al. |
| 7,133,282 B2 | 11/2006 | Sone |
| 7,162,678 B2 | 1/2007 | Saliba |
| 7,173,852 B2 | 2/2007 | Gorobets et al. |
| 7,184,446 B2 | 2/2007 | Rashid et al. |
| 7,275,170 B2 | 9/2007 | Suzuki |
| 7,328,377 B1 | 2/2008 | Lewis et al. |
| 7,516,292 B2 | 4/2009 | Kimura et al. |
| 7,523,157 B2 | 4/2009 | Aguilar, Jr. et al. |
| 7,527,466 B2 | 5/2009 | Simmons |
| 7,529,466 B2 | 5/2009 | Takahashi |
| 7,533,214 B2 | 5/2009 | Aasheim et al. |
| 7,546,478 B2 | 6/2009 | Kubo et al. |
| 7,566,987 B2 | 7/2009 | Black et al. |
| 7,571,277 B2 | 8/2009 | Mizushima |
| 7,574,554 B2 | 8/2009 | Tanaka et al. |
| 7,596,643 B2 | 9/2009 | Merry, Jr. et al. |
| 7,681,106 B2 | 3/2010 | Jarrar et al. |
| 7,685,494 B1 | 3/2010 | Varnica et al. |
| 7,707,481 B2 | 4/2010 | Kirschner et al. |
| 7,761,655 B2 | 7/2010 | Mizushima et al. |
| 7,765,454 B2 | 7/2010 | Passint |
| 7,774,390 B2 | 8/2010 | Shin |
| 7,840,762 B2 | 11/2010 | Oh et al. |
| 7,870,326 B2 | 1/2011 | Shin et al. |
| 7,890,818 B2 | 2/2011 | Kong et al. |
| 7,913,022 B1 | 3/2011 | Baxter |
| 7,925,960 B2 | 4/2011 | Ho et al. |
| 7,934,052 B2 | 4/2011 | Prins et al. |
| 7,945,825 B2 | 5/2011 | Cohen et al. |
| 7,954,041 B2 | 5/2011 | Hong et al. |
| 7,971,112 B2 | 6/2011 | Murata |
| 7,974,368 B2 | 7/2011 | Shieh et al. |
| 7,978,516 B2 | 7/2011 | Olbrich et al. |
| 7,996,642 B1 | 8/2011 | Smith |
| 8,006,161 B2 | 8/2011 | Lestable et al. |
| 8,032,724 B1 | 10/2011 | Smith |
| 8,041,884 B2 | 10/2011 | Chang |
| 8,042,011 B2 | 10/2011 | Nicolaidis et al. |
| 8,069,390 B2 | 11/2011 | Lin |
| 8,190,967 B2 | 5/2012 | Hong et al. |
| 8,250,380 B2 | 8/2012 | Guyot |
| 8,254,181 B2 | 8/2012 | Hwang et al. |
| 8,259,506 B1 | 9/2012 | Sommer et al. |
| 8,312,349 B2 | 11/2012 | Reche et al. |
| 8,412,985 B1 | 4/2013 | Bowers et al. |
| 8,429,436 B2 | 4/2013 | Fillingim et al. |
| 8,438,459 B2 | 5/2013 | Cho et al. |
| 8,453,022 B2 | 5/2013 | Katz |
| 8,627,117 B2 | 1/2014 | Johnston |
| 8,634,248 B1 | 1/2014 | Sprouse et al. |
| 8,694,854 B1 | 4/2014 | Dar et al. |
| 8,724,789 B2 | 5/2014 | Altberg et al. |
| 8,885,434 B2 | 11/2014 | Kumar |
| 8,898,373 B1 | 11/2014 | Kang et al. |
| 8,910,030 B2 | 12/2014 | Goel |
| 8,923,066 B1 | 12/2014 | Subramanian et al. |
| 9,128,690 B2 | 9/2015 | Lotzenburger et al. |
| 2001/0050824 A1 | 12/2001 | Buch |
| 2002/0024846 A1 | 2/2002 | Kawahara et al. |
| 2002/0036515 A1 | 3/2002 | Eldridge et al. |
| 2002/0083299 A1 | 6/2002 | Van Huben et al. |
| 2002/0122334 A1 | 9/2002 | Lee et al. |
| 2002/0152305 A1 | 10/2002 | Jackson et al. |
| 2002/0162075 A1 | 10/2002 | Talagala et al. |
| 2002/0165896 A1 | 11/2002 | Kim |
| 2003/0041299 A1 | 2/2003 | Kanazawa et al. |
| 2003/0043829 A1 | 3/2003 | Rashid et al. |
| 2003/0079172 A1 | 4/2003 | Yamagishi et al. |
| 2003/0088805 A1 | 5/2003 | Majni et al. |
| 2003/0093628 A1 | 5/2003 | Matter et al. |
| 2003/0163594 A1 | 8/2003 | Aasheim et al. |
| 2003/0163629 A1 | 8/2003 | Conley et al. |
| 2003/0188045 A1 | 10/2003 | Jacobson |
| 2003/0189856 A1 | 10/2003 | Cho et al. |
| 2003/0198100 A1 | 10/2003 | Matsushita et al. |
| 2003/0204341 A1 | 10/2003 | Guliani et al. |
| 2003/0212719 A1 | 11/2003 | Yasuda et al. |
| 2004/0024957 A1 | 2/2004 | Lin et al. |
| 2004/0024963 A1 | 2/2004 | Talagala et al. |
| 2004/0057575 A1 | 3/2004 | Zhang et al. |
| 2004/0062157 A1 | 4/2004 | Kawabe |
| 2004/0073829 A1 | 4/2004 | Olarig |
| 2004/0114265 A1 | 6/2004 | Talbert |
| 2004/0143710 A1 | 7/2004 | Walmsley |
| 2004/0148561 A1 | 7/2004 | Shen et al. |
| 2004/0153902 A1 | 8/2004 | Machado et al. |
| 2004/0167898 A1 | 8/2004 | Margolus et al. |
| 2004/0181734 A1 | 9/2004 | Saliba |
| 2004/0199714 A1 | 10/2004 | Estakhri et al. |
| 2004/0237018 A1 | 11/2004 | Riley |
| 2005/0060456 A1 | 3/2005 | Shrader et al. |
| 2005/0060501 A1 | 3/2005 | Shrader et al. |
| 2005/0073884 A1 | 4/2005 | Gonzalez et al. |
| 2005/0108588 A1 | 5/2005 | Yuan |

(56) References Cited

U.S. PATENT DOCUMENTS

| | | |
|---|---|---|
| 2005/0114587 A1 | 5/2005 | Chou et al. |
| 2005/0172065 A1 | 8/2005 | Keays |
| 2005/0172207 A1 | 8/2005 | Radke et al. |
| 2005/0193161 A1 | 9/2005 | Lee et al. |
| 2005/0201148 A1 | 9/2005 | Chen et al. |
| 2005/0231765 A1 | 10/2005 | So et al. |
| 2005/0249013 A1 | 11/2005 | Janzen et al. |
| 2005/0251617 A1 | 11/2005 | Sinclair et al. |
| 2005/0257120 A1 | 11/2005 | Gorobets et al. |
| 2005/0273560 A1 | 12/2005 | Hulbert et al. |
| 2005/0289314 A1 | 12/2005 | Adusumilli et al. |
| 2006/0010174 A1 | 1/2006 | Nguyen et al. |
| 2006/0039196 A1 | 2/2006 | Gorobets et al. |
| 2006/0039227 A1 | 2/2006 | Lai et al. |
| 2006/0053246 A1 | 3/2006 | Lee |
| 2006/0069932 A1 | 3/2006 | Oshikawa et al. |
| 2006/0085671 A1 | 4/2006 | Majni et al. |
| 2006/0087893 A1 | 4/2006 | Nishihara et al. |
| 2006/0107181 A1 | 5/2006 | Dave et al. |
| 2006/0136570 A1 | 6/2006 | Pandya |
| 2006/0136681 A1 | 6/2006 | Jain et al. |
| 2006/0156177 A1 | 7/2006 | Kottapalli et al. |
| 2006/0195650 A1 | 8/2006 | Su et al. |
| 2006/0244049 A1 | 11/2006 | Yaoi et al. |
| 2006/0259528 A1 | 11/2006 | Dussud et al. |
| 2006/0291301 A1 | 12/2006 | Ziegelmayer |
| 2007/0011413 A1 | 1/2007 | Nonaka et al. |
| 2007/0058446 A1 | 3/2007 | Hwang et al. |
| 2007/0061597 A1 | 3/2007 | Holtzman et al. |
| 2007/0076479 A1 | 4/2007 | Kim et al. |
| 2007/0081408 A1 | 4/2007 | Kwon et al. |
| 2007/0083697 A1 | 4/2007 | Birrell et al. |
| 2007/0088716 A1 | 4/2007 | Brumme et al. |
| 2007/0091677 A1 | 4/2007 | Lasser et al. |
| 2007/0113019 A1 | 5/2007 | Beukema et al. |
| 2007/0133312 A1 | 6/2007 | Roohparvar |
| 2007/0147113 A1 | 6/2007 | Mokhlesi et al. |
| 2007/0150790 A1 | 6/2007 | Gross et al. |
| 2007/0156842 A1 | 7/2007 | Vermeulen et al. |
| 2007/0157064 A1 | 7/2007 | Falik et al. |
| 2007/0174579 A1 | 7/2007 | Shin |
| 2007/0180188 A1 | 8/2007 | Fujibayashi et al. |
| 2007/0180346 A1 | 8/2007 | Murin |
| 2007/0201274 A1 | 8/2007 | Yu et al. |
| 2007/0208901 A1 | 9/2007 | Purcell et al. |
| 2007/0234143 A1 | 10/2007 | Kim |
| 2007/0245061 A1 | 10/2007 | Harriman |
| 2007/0245099 A1 | 10/2007 | Gray et al. |
| 2007/0263442 A1 | 11/2007 | Cornwell et al. |
| 2007/0277036 A1 | 11/2007 | Chamberlain et al. |
| 2007/0279988 A1 | 12/2007 | Nguyen |
| 2007/0291556 A1 | 12/2007 | Kamei |
| 2007/0294496 A1 | 12/2007 | Goss et al. |
| 2007/0300130 A1 | 12/2007 | Gorobets |
| 2008/0013390 A1 | 1/2008 | Zipprich-Rasch |
| 2008/0019182 A1 | 1/2008 | Yanagidaira et al. |
| 2008/0022163 A1 | 1/2008 | Tanaka et al. |
| 2008/0028275 A1 | 1/2008 | Chen et al. |
| 2008/0043871 A1 | 2/2008 | Latouche et al. |
| 2008/0052446 A1 | 2/2008 | Lasser et al. |
| 2008/0056005 A1 | 3/2008 | Aritome |
| 2008/0071971 A1 | 3/2008 | Kim et al. |
| 2008/0077841 A1 | 3/2008 | Gonzalez et al. |
| 2008/0077937 A1 | 3/2008 | Shin et al. |
| 2008/0086677 A1 | 4/2008 | Yang et al. |
| 2008/0112226 A1 | 5/2008 | Mokhlesi |
| 2008/0141043 A1 | 6/2008 | Flynn et al. |
| 2008/0144371 A1 | 6/2008 | Yeh et al. |
| 2008/0147714 A1 | 6/2008 | Breternitz et al. |
| 2008/0147964 A1 | 6/2008 | Chow et al. |
| 2008/0147998 A1 | 6/2008 | Jeong |
| 2008/0148124 A1 | 6/2008 | Zhang et al. |
| 2008/0163030 A1 | 7/2008 | Lee |
| 2008/0168191 A1 | 7/2008 | Biran et al. |
| 2008/0168319 A1 | 7/2008 | Lee et al. |
| 2008/0170460 A1 | 7/2008 | Oh et al. |
| 2008/0229000 A1 | 9/2008 | Kim |
| 2008/0229003 A1 | 9/2008 | Mizushima et al. |
| 2008/0229176 A1 | 9/2008 | Arnez et al. |
| 2008/0270680 A1 | 10/2008 | Chang |
| 2008/0282128 A1 | 11/2008 | Lee et al. |
| 2008/0285351 A1 | 11/2008 | Shlick et al. |
| 2008/0313132 A1 | 12/2008 | Hao et al. |
| 2009/0003058 A1 | 1/2009 | Kang |
| 2009/0019216 A1 | 1/2009 | Yamada et al. |
| 2009/0031083 A1 | 1/2009 | Willis et al. |
| 2009/0037652 A1 | 2/2009 | Yu et al. |
| 2009/0070608 A1 | 3/2009 | Kobayashi |
| 2009/0116283 A1 | 5/2009 | Ha et al. |
| 2009/0125671 A1 | 5/2009 | Flynn et al. |
| 2009/0144598 A1 | 6/2009 | Yoon et al. |
| 2009/0168525 A1 | 7/2009 | Olbrich et al. |
| 2009/0172258 A1 | 7/2009 | Olbrich et al. |
| 2009/0172259 A1 | 7/2009 | Prins et al. |
| 2009/0172260 A1 | 7/2009 | Olbrich et al. |
| 2009/0172261 A1 | 7/2009 | Prins et al. |
| 2009/0172262 A1 | 7/2009 | Olbrich et al. |
| 2009/0172308 A1 | 7/2009 | Prins et al. |
| 2009/0172335 A1 | 7/2009 | Kulkarni et al. |
| 2009/0172499 A1 | 7/2009 | Olbrich et al. |
| 2009/0193058 A1 | 7/2009 | Reid |
| 2009/0204823 A1 | 8/2009 | Giordano et al. |
| 2009/0207660 A1 | 8/2009 | Hwang et al. |
| 2009/0213649 A1 | 8/2009 | Takahashi et al. |
| 2009/0222708 A1 | 9/2009 | Yamaga |
| 2009/0228761 A1 | 9/2009 | Perlmutter et al. |
| 2009/0249160 A1 | 10/2009 | Gao et al. |
| 2009/0268521 A1 | 10/2009 | Ueno et al. |
| 2009/0292972 A1 | 11/2009 | Seol et al. |
| 2009/0296466 A1 | 12/2009 | Kim et al. |
| 2009/0296486 A1 | 12/2009 | Kim et al. |
| 2009/0310422 A1 | 12/2009 | Edahiro et al. |
| 2009/0319864 A1 | 12/2009 | Shrader |
| 2010/0002506 A1 | 1/2010 | Cho et al. |
| 2010/0008175 A1 | 1/2010 | Sweere et al. |
| 2010/0011261 A1 | 1/2010 | Cagno et al. |
| 2010/0020620 A1 | 1/2010 | Kim et al. |
| 2010/0037012 A1 | 2/2010 | Yano et al. |
| 2010/0061151 A1 | 3/2010 | Miwa et al. |
| 2010/0091535 A1 | 4/2010 | Sommer et al. |
| 2010/0103737 A1 | 4/2010 | Park |
| 2010/0110798 A1 | 5/2010 | Hoei et al. |
| 2010/0118608 A1 | 5/2010 | Song et al. |
| 2010/0138592 A1 | 6/2010 | Cheon |
| 2010/0153616 A1 | 6/2010 | Garratt |
| 2010/0161936 A1 | 6/2010 | Royer et al. |
| 2010/0174959 A1 | 7/2010 | No et al. |
| 2010/0199125 A1 | 8/2010 | Reche |
| 2010/0199138 A1 | 8/2010 | Rho |
| 2010/0202196 A1 | 8/2010 | Lee et al. |
| 2010/0202239 A1 | 8/2010 | Moshayedi et al. |
| 2010/0208521 A1 | 8/2010 | Kim et al. |
| 2010/0262889 A1 | 10/2010 | Bains |
| 2010/0281207 A1 | 11/2010 | Miller et al. |
| 2010/0281342 A1 | 11/2010 | Chang et al. |
| 2010/0332858 A1 | 12/2010 | Trantham et al. |
| 2011/0010514 A1 | 1/2011 | Benhase et al. |
| 2011/0051513 A1 | 3/2011 | Shen et al. |
| 2011/0066597 A1 | 3/2011 | Mashtizadeh et al. |
| 2011/0072302 A1 | 3/2011 | Sartore |
| 2011/0078407 A1 | 3/2011 | Lewis |
| 2011/0083060 A1 | 4/2011 | Sakurada et al. |
| 2011/0099460 A1 | 4/2011 | Dusija et al. |
| 2011/0113281 A1 | 5/2011 | Zhang et al. |
| 2011/0122691 A1 | 5/2011 | Sprouse |
| 2011/0131444 A1 | 6/2011 | Buch et al. |
| 2011/0138260 A1 | 6/2011 | Savin |
| 2011/0173378 A1 | 7/2011 | Filor et al. |
| 2011/0179249 A1 | 7/2011 | Hsiao |
| 2011/0199825 A1 | 8/2011 | Han et al. |
| 2011/0205823 A1 | 8/2011 | Hemink et al. |
| 2011/0213920 A1 | 9/2011 | Frost et al. |
| 2011/0222342 A1 | 9/2011 | Yoon et al. |
| 2011/0225346 A1 | 9/2011 | Goss et al. |

(56) References Cited

U.S. PATENT DOCUMENTS

| | | |
|---|---|---|
| 2011/0228601 A1 | 9/2011 | Olbrich et al. |
| 2011/0231600 A1 | 9/2011 | Tanaka et al. |
| 2011/0239077 A1 | 9/2011 | Bai et al. |
| 2011/0264843 A1 | 10/2011 | Haines et al. |
| 2011/0271040 A1 | 11/2011 | Kamizono |
| 2011/0283119 A1 | 11/2011 | Szu et al. |
| 2011/0289125 A1 | 11/2011 | Guthery |
| 2012/0011393 A1 | 1/2012 | Roberts et al. |
| 2012/0017053 A1 | 1/2012 | Yang et al. |
| 2012/0023144 A1* | 1/2012 | Rub .................. 707/813 |
| 2012/0054414 A1 | 3/2012 | Tsai et al. |
| 2012/0063234 A1 | 3/2012 | Shiga et al. |
| 2012/0072639 A1 | 3/2012 | Goss et al. |
| 2012/0096217 A1 | 4/2012 | Son et al. |
| 2012/0110250 A1 | 5/2012 | Sabbag et al. |
| 2012/0117317 A1 | 5/2012 | Sheffler |
| 2012/0151124 A1 | 6/2012 | Baek et al. |
| 2012/0151253 A1 | 6/2012 | Horn |
| 2012/0151294 A1 | 6/2012 | Yoo et al. |
| 2012/0173797 A1 | 7/2012 | Shen |
| 2012/0173826 A1 | 7/2012 | Takaku |
| 2012/0185750 A1 | 7/2012 | Hayami |
| 2012/0195126 A1 | 8/2012 | Roohparvar |
| 2012/0203951 A1 | 8/2012 | Wood et al. |
| 2012/0210095 A1 | 8/2012 | Nellans et al. |
| 2012/0216079 A1 | 8/2012 | Fai et al. |
| 2012/0233391 A1 | 9/2012 | Frost et al. |
| 2012/0236658 A1 | 9/2012 | Byom et al. |
| 2012/0239858 A1 | 9/2012 | Melik-Martirosian |
| 2012/0239868 A1 | 9/2012 | Ryan et al. |
| 2012/0239976 A1 | 9/2012 | Cometti et al. |
| 2012/0259863 A1 | 10/2012 | Bodwin et al. |
| 2012/0275466 A1 | 11/2012 | Bhadra et al. |
| 2012/0278564 A1 | 11/2012 | Goss et al. |
| 2012/0284574 A1 | 11/2012 | Avila et al. |
| 2012/0284587 A1 | 11/2012 | Yu et al. |
| 2013/0007073 A1 | 1/2013 | Varma |
| 2013/0007343 A1 | 1/2013 | Rub et al. |
| 2013/0007543 A1 | 1/2013 | Goss et al. |
| 2013/0024735 A1 | 1/2013 | Chung et al. |
| 2013/0031438 A1 | 1/2013 | Hu et al. |
| 2013/0036418 A1 | 2/2013 | Yadappanavar et al. |
| 2013/0038380 A1 | 2/2013 | Cordero et al. |
| 2013/0047045 A1 | 2/2013 | Hu et al. |
| 2013/0073924 A1 | 3/2013 | D'Abreu et al. |
| 2013/0079942 A1 | 3/2013 | Smola et al. |
| 2013/0086131 A1 | 4/2013 | Hunt et al. |
| 2013/0086132 A1 | 4/2013 | Hunt et al. |
| 2013/0094288 A1 | 4/2013 | Patapoutian et al. |
| 2013/0111279 A1 | 5/2013 | Jeon et al. |
| 2013/0111298 A1 | 5/2013 | Seroff et al. |
| 2013/0117606 A1 | 5/2013 | Anholt et al. |
| 2013/0121084 A1 | 5/2013 | Jeon et al. |
| 2013/0124888 A1 | 5/2013 | Tanaka et al. |
| 2013/0128666 A1 | 5/2013 | Avila et al. |
| 2013/0132652 A1 | 5/2013 | Wood et al. |
| 2013/0176784 A1 | 7/2013 | Cometti et al. |
| 2013/0179646 A1 | 7/2013 | Okubo et al. |
| 2013/0191601 A1 | 7/2013 | Peterson et al. |
| 2013/0194865 A1 | 8/2013 | Bandic et al. |
| 2013/0194874 A1 | 8/2013 | Mu et al. |
| 2013/0232289 A1 | 9/2013 | Zhong et al. |
| 2013/0254507 A1 | 9/2013 | Islam et al. |
| 2013/0258738 A1 | 10/2013 | Barkon et al. |
| 2013/0265838 A1 | 10/2013 | Li |
| 2013/0282955 A1 | 10/2013 | Parker et al. |
| 2013/0290611 A1 | 10/2013 | Biederman et al. |
| 2013/0301373 A1 | 11/2013 | Tam |
| 2013/0304980 A1 | 11/2013 | Nachimuthu et al. |
| 2013/0343131 A1 | 12/2013 | Wu et al. |
| 2014/0013188 A1 | 1/2014 | Wu et al. |
| 2014/0063905 A1 | 3/2014 | Ahn et al. |
| 2014/0075133 A1 | 3/2014 | Li et al. |
| 2014/0082261 A1 | 3/2014 | Cohen et al. |
| 2014/0082456 A1 | 3/2014 | Liu |
| 2014/0095775 A1 | 4/2014 | Talagala et al. |
| 2014/0122818 A1 | 5/2014 | Hayasaka et al. |
| 2014/0122907 A1 | 5/2014 | Johnston |
| 2014/0136883 A1 | 5/2014 | Cohen |
| 2014/0136927 A1 | 5/2014 | Li et al. |
| 2014/0143505 A1 | 5/2014 | Sim et al. |
| 2014/0201596 A1 | 7/2014 | Baum et al. |
| 2014/0223084 A1 | 8/2014 | Lee et al. |
| 2014/0258755 A1 | 9/2014 | Stenfort |
| 2014/0269090 A1 | 9/2014 | Flynn et al. |
| 2014/0310494 A1 | 10/2014 | Higgins et al. |
| 2014/0359381 A1 | 12/2014 | Takeuchi et al. |
| 2015/0023097 A1 | 1/2015 | Khoueir et al. |
| 2015/0153799 A1 | 6/2015 | Lucas et al. |

FOREIGN PATENT DOCUMENTS

| | | |
|---|---|---|
| EP | 1 990 921 A2 | 11/2008 |
| EP | 2 386 958 A1 | 11/2011 |
| EP | 2 620 946 A2 | 7/2013 |
| JP | 2002-532806 S | 10/2002 |
| WO | WO 2007/036834 A2 | 4/2007 |
| WO | WO 2007/080586 A2 | 7/2007 |
| WO | WO 2008/075292 | 6/2008 |
| WO | WO 2008/121553 A1 | 10/2008 |
| WO | WO 2008/121577 A1 | 10/2008 |
| WO | WO 2009/028281 A1 | 3/2009 |
| WO | WO 2009/032945 A1 | 3/2009 |
| WO | WO 2009/058140 A1 | 5/2009 |
| WO | WO 2009/084724 | 7/2009 |
| WO | WO 2009/134576 A1 | 11/2009 |
| WO | WO 2011/024015 | 3/2011 |

OTHER PUBLICATIONS

Bhattacharjee et al., "Efficient Index Compression in DB2 LUW", IBM Research Report, Jun. 23, 2009, http://domino.research.ibm.com/library/cyberdig.nsf/papers/40B2C45876D0D747852575E100620CE7/$File/rc24815.pdf, 13 pages.

Oracle, "Oracle9i: Database Concepts", Jul. 2001, http://docs.oracle.com/cd/A91202_01/901 doc/server.901/a88856.pdf, 49 pages.

International Search Report and Written Opinion dated Jun. 8, 2015, received in International Patent Application No. PCT/US2015/018252, which corresponds to U.S. Appl. No. 14/339,072, 9 pages (Busch).

International Search Report and Written Opinion dated Jun. 2, 2015, received in International Patent Application No. PCT/US2015/018255, which corresponds to U.S. Appl. No. 14/336,967, 14 pages (Chander).

International Search Report and Written Opinion dated Jun. 30, 2015, received in International Patent Application No. PCT/US2015/023927, which corresponds to U.S. Appl. No. 14/454,687, 11 pages (Kadayam).

International Search Report and Written Opinion dated Jul. 23, 2015, received in International Patent Application No. PCT/US2015/030850, which corresponds to U.S. Appl. No. 14/298,843, 12 pages (Ellis).

Barr, Introduction to Watchdog Timers, Oct. 2001, 3 pgs.

Canim, Buffered Bloom ilters on Solid State Storage, ADMS*10, Singapore, Sep. 13-17, 2010, 8 pgs.

Kang, A Multi-Channel Architecture for High-Performance NAND Flash-Based Storage System, J. Syst. Archit., 53, 9, Sep. 2007, 15 pgs.

Kim, A Space-Efficient Flash Translation Layer for CompactFlash Systems, May 2002, 10 pgs.

Lu, A Forest-structured Bloom Filter with Flash Memory, MSST 2011, Denver, CO, May 23-27, 2011, article, 6 pgs.

Lu, A Forest-structured Bloom Filter with Flash Memory, MSST 2011, Denver, CO, May 23-27, 2011, presentation slides, 25 pgs.

McLean, Information Technology-AT Attachment with Packet Interface Extension, Aug. 19, 1998, 339 pgs.

Park, A High Performance Controller for NAND Flash-Based Solid State Disk (NSSD), Feb. 12-16, 2006, 4 pgs.

(56) References Cited

OTHER PUBLICATIONS

Pliant Technology, International Search Report / Written Opinion, PCT/US08/88133, Mar. 19, 2009, 7 pgs.
Pliant Technology, International Search Report / Written Opinion, PCT/US08/88136, Mar. 19, 2009, 7 pgs.
Pliant Technology, International Search Report / Written Opinion, PCT/US08/88146, Feb. 26, 2009, 10 pgs.
Pliant Technology, International Search Report / Written Opinion, PCT/US08/88154, Feb. 27, 2009, 8 pgs.
Pliant Technology, International Search Report / Written Opinion, PCT/US08/88164, Feb. 13, 2009, 6 pgs.
Pliant Technology, International Search Report / Written Opinion, PCT/US08/88206, Feb. 18, 2009, 8 pgs.
Pliant Technology, International Search Report / Written Opinion, PCT/US08/88217, Feb. 19, 2009, 7 pgs.
Pliant Technology, International Search Report / Written Opinion, PCT/US08/88229, Feb. 13, 2009, 7 pgs.
Pliant Technology, International Search Report / Written Opinion, PCT/US08/88232, Feb. 19, 2009, 8 pgs.
Pliant Technology, International Search Report / Written Opinion, PCT/US08/88236, Feb. 19, 2009, 7 pgs.
Pliant Technology, International Search Report / Written Opinion, PCT/US2011/028637, Oct. 27, 2011, 11 pgs.
Pliant Technology, Supplementary ESR, 08866997.3, Feb. 23, 2012, 6 pgs.
SanDisk Enterprise IP LLC, International Search Report / Written Opinion, PCT/US2012/042764, Aug. 31, 2012, 12 pgs.
SanDisk Enterprise IP LLC, International Search Report / Written Opinion, PCT/US2012/042771, Mar. 4, 2013, 14 pgs.
SanDisk Enterprise IP LLC, International Search Report / Written Opinion, PCT/US2012/042775, Sep. 26, 2012, 8 pgs.
SanDisk Enterprise IP LLC, International Search Report / Written Opinion, PCT/US2012/059447, Jun. 6, 2013, 12 pgs.
SanDisk Enterprise IP LLC, International Search Report / Written Opinion, PCT/US2012/059453, Jun. 6, 2013, 12 pgs.
Sandisk Enterprise IP LLC, International Search Report / Written Opinion, PCT/US2012/059459, Feb. 14, 2013, 9 pgs.
SanDisk Enterprise IP LLC, International Search Report / Written Opinion, PCT/US2012/065914, May 23, 2013, 7 pgs.
SanDisk Enterprise IP LLC, International Search Report / Written Opinion, PCT/US2012/065916, Apr. 5, 2013, 7 pgs.
SanDisk Enterprise IP LLC, International Search Report / Written Opinion, PCT/US2012/065919, Jun. 17, 2013, 8 pgs.
SanDisk Enterprise IP LLC, Notification of the Decision to Grant a Patent Right for Patent for Invention, CN 200880127623.8, Jul. 4, 2013, 1 pg.
SanDisk Enterprise IP LLC, Office Action, CN 200880127623.8, Apr. 18, 2012, 12 pgs.
SanDisk Enterprise IP LLC, Office Action, CN 200880127623.8, Dec. 31, 2012, 9 pgs.
SanDisk Enterprise IP LLC, Office Action, JP 2010-540863, Jul. 24, 2012, 3 pgs.
Watchdog Timer and Power Savin Modes, Microchip Technology Inc., 2005, 14 pgs.
Zeidman, 1999 Verilog Designer's Library, 9 pgs.
International Search Report and Written Opinion dated Jul. 25, 2014, received in International Patent Application No. PCT/US2014/029453, which corresponds to U.S. Appl. No. 13/963,444, 9 pages (Frayer).
International Search Report and Written Opinion dated Mar. 7, 2014, received in International Patent Application No. PCT/US2013/074772, which corresponds to U.S. Appl. No. 13/831,218, 10 pages (George).
International Search Report and Written Opinion dated Mar. 24, 2014, received in International Patent Application No. PCT/US2013/074777, which corresponds to U.S. Appl. No. 13/831,308, 10 pages (George).
International Search Report and Written Opinion dated Mar. 7, 2014, received in International Patent Application No. PCT/US2013/074779, which corresponds to U.S. Appl. No. 13/831,374, 8 pages (George).
Invitation to Pay Additional Fees dated Feb. 13, 2015, received in international Patent Application No. PCT/US2014/063949, which corresponds to U.S. Appl. No. 14/135,433, 6 pages (Delpapa).
International Search Report and Wrltten Opinion dated Jan. 21, 2015, received in International Application No. PCT/US2014/059748, which corresponds to U.S. Appl. No. 14/137,511, 13 pages (Dancho).
International Search Report and Written Opinion dated Feb. 18, 2015, received in International Application No. PCT/US2014/066921, which corresponds to U.S. Appl. No. 14/135,280, 13 pages (Fitzpatrick).
Ashkenazi et aL., "Platform independent overall security architecture in multi-processor system-on-chip integrated circuits for use in mobile phones and handheld devices," ScienceDirect, Computers and Electrical Engineering 33 (2007), 18 pages.
Lee et al., "A Semi-Preemptive Garbage Collector for Solid State Drives," Apr 2011, IEEE, pp. 12-21.
Office Action dated Feb. 17, 2015, received in Chinese Patent Application No. 201210334987.1, which corresponds to U.S. Appl. No. 12/082,207, 9 pages (Prins).
International Search Report and Written Opinion dated May 4, 2015, received in International Patent Application No. PCT/US2014/065987, which corresponds to U.S. Appl. No. 14/135,400, 12 pages (George).
International Search Report and Written Opinion dated Mar. 17, 2015, received in International Patent Application No. PCT/US2014/067407, which corresponds to U.S. Appl. No. 14/135,420, 13 pages (Lucas).
International Search Report and Written Opinion dated Apr. 20, 2015, received in International Patent Application No. PCT/US2014/063949, which corresponds to U.S. Appl. No. 14/135,433, 21 pages (Delpapa).
International Search Report and Written Opinion dated Mar. 9, 2015, received in International Patent Appilcation No. PCT/U52014/059747, which corresponds to U.S. Appl. No. 14/137,440, 9 pages (Fitzpatrick).
IBM Research-Zurich, "The Fundamental Limit of Flash Random Write Performance: Understanding, Analysis and Performance Modeling," Mar. 31, 2010, pp. 1-15.
Office Action dated Dec. 8, 2014, received in Chinese Patent Application No. 201180021660.2, which corresponds to U.S. Appl. No. 12/726,200, 7 pages (Olbrich).
Office Action dated Jul. 31, 2015, received in Chinese Patent Application No. 201180021660.2, which corresponds to U.S. Appl. No. 12/726,200, 9 pages (Olbrich).
International Search Report and Written Opinion dated Sep. 14, 2015, received in International Patent Application No. PCT/US2015/036807, which corresponds to U.S. Appl. No. 14/311,152, 9 pages (Higgins).
Gasior, "Gigabyte's i-Ram storage device, Ram disk without the fuss," The Tech Report, p. 1, Jan. 25, 2006, 5 pages.

* cited by examiner

BIASING FOR WEAR LEVELING IN STORAGE SYSTEMS

RELATED APPLICATION

This application claims priority to U.S. Provisional Patent Application Ser. No. 61/893,102, filed Oct. 18, 2013, entitled "Biasing for Wear Leveling in Storage Systems," which is hereby incorporated by reference in its entirety.

TECHNICAL FIELD

The disclosed embodiments relate generally to memory systems, and in particular, to biasing for wear leveling for a storage medium in a storage system.

BACKGROUND

Semiconductor memory devices, including flash memory, typically utilize memory cells to store data as an electrical value, such as an electrical charge or voltage. A flash memory cell, for example, includes a single transistor with a floating gate that is used to store a charge representative of a data value. Flash memory is a non-volatile data storage device that can be electrically erased and reprogrammed. More generally, non-volatile memory (e.g., flash memory, as well as other types of non-volatile memory implemented using any of a variety of technologies) retains stored information even when not powered, as opposed to volatile memory, which requires power to maintain the stored information.

Historically, wear leveling has been defined as a technique used to distribute program-erase cycles as evenly as possible across units of a memory device. For example, for a flash memory device, if a particular block of memory is programmed and erased repeatedly without writing to any other blocks, the one block of memory would wear out before all the other blocks, prematurely ending the life of the memory device. Ideally, wear leveling would enable every block to be used to its maximum life. However, even with uniform workloads, simply distributing program-erase cycles as evenly as possible across all the units of a memory device may not maximize the life of the memory device. Since different units of a memory device may have different wear characteristics, it is important to utilize a wear leveling scheme that accounts for different wear characteristics.

SUMMARY

Various implementations of systems, methods and devices within the scope of the appended claims each have several aspects, no single one of which is solely responsible for the attributes described herein. Without limiting the scope of the appended claims, after considering this disclosure, and particularly after considering the section entitled "Detailed Description" one will understand how the aspects of various implementations are used to enable biasing for wear leveling in storage systems. In one aspect, garbage collection is performed in accordance with garbage collection control metrics of a plurality of erase units, each garbage collection control metric biased in accordance with an age metric of a respective erase unit in relation to the representative age metric of the plurality of erase units.

BRIEF DESCRIPTION OF THE DRAWINGS

So that the present disclosure can be understood in greater detail, a more particular description may be had by reference to the features of various implementations, some of which are illustrated in the appended drawings. The appended drawings, however, merely illustrate the more pertinent features of the present disclosure and are therefore not to be considered limiting, for the description may admit to other effective features.

Figure 1:
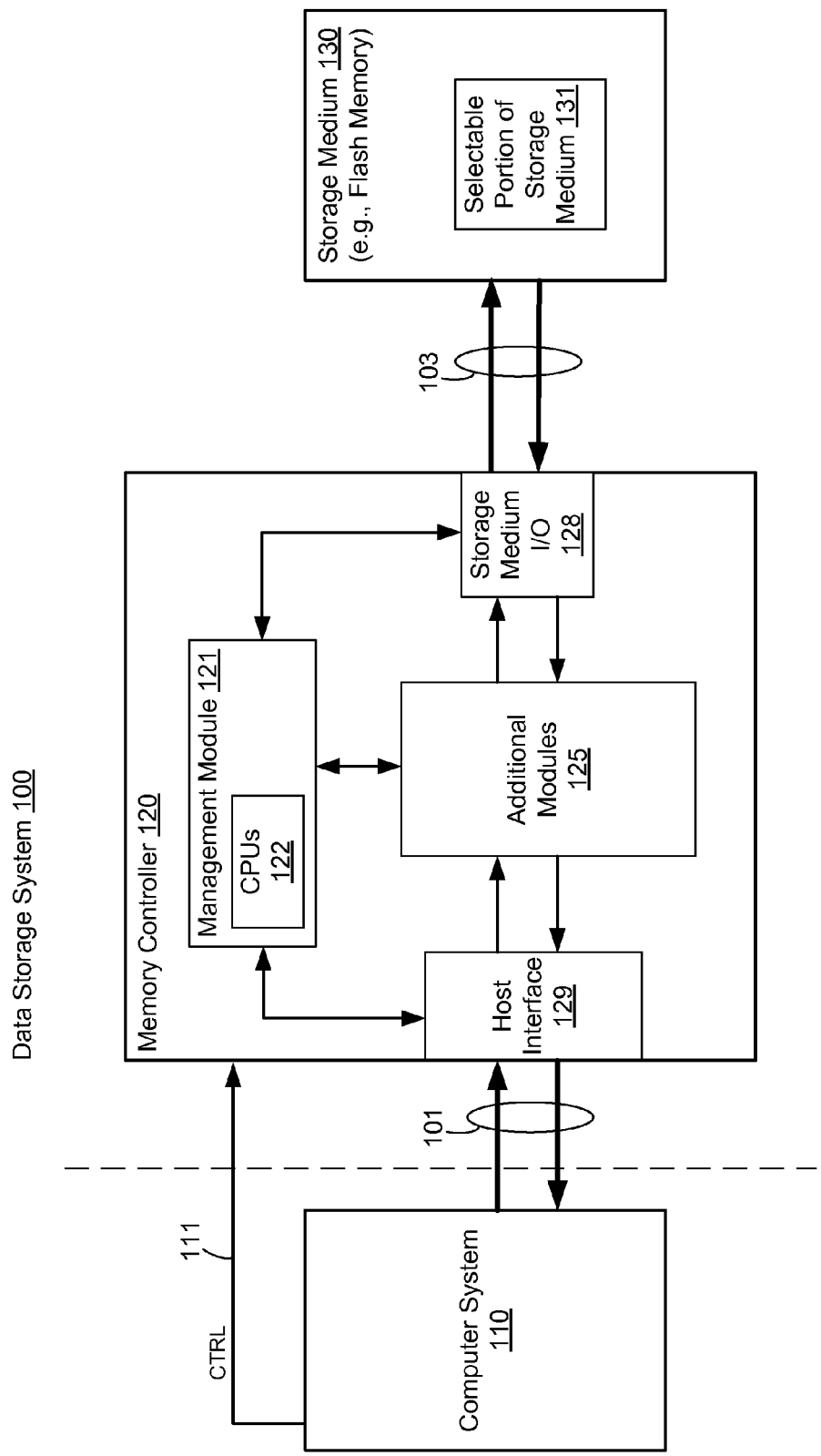
FIG. 1 is a block diagram illustrating an implementation of a data storage system, in accordance with some embodiments.

In accordance with common practice the various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals may be used to denote like features throughout the specification and figures.

DETAILED DESCRIPTION

The various implementations described herein include systems, methods and/or devices used to enable biasing for wear leveling for a storage medium in a storage system. Some implementations include systems, methods and/or devices to perform garbage collection in accordance with garbage collection control metrics of a plurality of erase units, each garbage collection control metric biased in accordance with an age metric of a respective erase unit in relation to the representative age metric of the plurality of erase units.

More specifically, some implementations include a method of wear leveling for a storage medium in a storage system. In some implementations, the method includes (1) determining, for each erase unit of a plurality of erase units in the storage medium, an age metric, (2) determining a representative age metric of the plurality of erase units, (3) for each respective erase unit of the plurality of erase units, biasing a respective garbage collection control metric for the respective erase unit in accordance with the age metric of the respective erase unit in relation to the representative age metric of the plurality of erase units to generate an adjusted garbage collection control metric for the respective erase unit, and (4) performing garbage collection for the storage medium in accordance with the adjusted garbage collection control metrics of the plurality of erase units.

In some embodiments, the garbage collection control metric is a valid-page count, and biasing the respective valid-page count for the respective erase unit includes (1) determining the respective valid-page count, wherein the respective valid-page count is a count of valid pages in the respective erase unit, (2) calculating a bias value for the respective erase unit in accordance with the age metric of the respective erase unit in relation to the representative age metric of the plurality of erase units, (3) in accordance with a first determination, the first determination including a determination that the age metric of the respective erase unit is greater than the representative age metric of the plurality of erase units, adding the bias value to the respective valid-page count for the respective erase unit to generate the adjusted valid-page count for the respective erase unit, and (4) in accordance with a second determination, the second determination including a determination that the age metric of the respective erase unit is less than the representative age metric of the plurality of erase units, subtracting the bias value from the respective valid-page count for the respective erase unit to generate the adjusted valid-page count for the respective erase unit.

In some embodiments, calculating the bias value for the respective erase unit includes (1) calculating a difference between the age metric of the respective erase unit and the representative age metric of the plurality of erase units, (2) calculating a first value, the first value determined by multiplying the absolute value of the calculated difference by a predefined number of valid pages, wherein the first value is limited to a predefined maximum, and (3) setting the bias value equal to the first value.

In some embodiments, performing garbage collection for the storage medium includes selecting an erase unit with the lowest adjusted valid-page count for garbage collection.

In some embodiments, performing garbage collection for the storage medium includes performing garbage collection on a first erase unit with a first adjusted valid-page count prior to performing garbage collection on a second erase unit with a second adjusted valid-page count, wherein the first adjusted valid-page count is less than the second adjusted valid-page count.

In some embodiments, biasing the respective garbage collection control metric for the respective erase unit includes (1) determining the respective garbage collection control metric, (2) calculating a bias value for the respective erase unit in accordance with the age metric of the respective erase unit in relation to the representative age metric of the plurality of erase units, including limiting a range of the bias value to a predefined range, and (3) mathematically adjusting the respective garbage collection control metric for the respective erase unit with the calculated bias value to generate the adjusted garbage collection control metric for the respective erase unit.

In some embodiments, the age metric for each erase unit is determined in accordance with a metric corresponding to an estimated remaining life of each erase unit.

In some embodiments, the erase unit is a single erase block.

In some embodiments, the erase unit is a super block, wherein the super block includes a plurality of erase blocks.

In some embodiments, the storage medium comprises one or more flash memory devices.

In some embodiments, determining, for each erase unit of a plurality of erase units in the storage medium, the age metric includes determining, for each storage unit of a plurality of storage units in the storage medium, an age metric for a respective storage unit, wherein each storage unit comprises a plurality of the erase units.

In another aspect, any of the methods described above are performed by a device operable to perform wear leveling for a storage medium, the device including (1) a storage medium interface for coupling the device to the storage medium, and (2) one or more modules, including a memory management module that includes one or more processors and memory storing one or more programs configured for execution by the one or more processors, the one or more modules coupled to the storage medium interface and configured to perform any of the methods described above.

In yet another aspect, any of the methods described above are performed by a device operable to perform wear leveling for a storage medium. In some embodiments, the device includes (1) a storage medium interface for coupling the device to the storage medium, (2) means for determining, for each erase unit of a plurality of erase units in the storage medium, an age metric, (3) means for determining a representative age metric of the plurality of erase units, (4) means for biasing, for each respective erase unit of the plurality of erase units, a respective garbage collection control metric for the respective erase unit in accordance with the age metric of the respective erase unit in relation to the representative age metric of the plurality of erase units to generate an adjusted garbage collection control metric for the respective erase unit, and (5) means for performing garbage collection for the storage medium in accordance with the adjusted garbage collection control metrics of the plurality of erase units.

In yet another aspect, any of the methods described above are performed by a storage system comprising (1) a storage medium (e.g., comprising one or more non-volatile storage devices, such as flash memory devices) (2) one or more processors, and (3) memory storing one or more programs, which when executed by the one or more processors cause the storage system to perform or control performance of any of the methods described above.

In yet another aspect, a non-transitory computer readable storage medium stores one or more programs configured for execution by a device coupled to a storage medium, the one or more programs comprising instructions for causing the device and/or storage medium to perform any of the methods described above.

Numerous details are described herein in order to provide a thorough understanding of the example implementations illustrated in the accompanying drawings. However, some embodiments may be practiced without many of the specific details, and the scope of the claims is only limited by those features and aspects specifically recited in the claims. Furthermore, well-known methods, components, and circuits have not been described in exhaustive detail so as not to unnecessarily obscure more pertinent aspects of the implementations described herein.

FIG. 1 is a diagram of an implementation of a data storage system 100, in accordance with some embodiments. While some example features are illustrated, various other features have not been illustrated for the sake of brevity and so as not to obscure more pertinent aspects of the example implementations disclosed herein. To that end, as a non-limiting example, the data storage system 100 includes a memory controller 120, and a storage medium 130, and is used in conjunction with a computer system 110. In some implementations, storage medium 130 is a single flash memory device while in other implementations storage medium 130 includes a plurality of flash memory devices. In some implementations, storage medium 130 is NAND-type flash memory or NOR-type flash memory. Further, in some implementations memory controller 120 is a solid-state drive (SSD) controller. However, other types of storage media may be included in accordance with aspects of a wide variety of implementations.

Computer system 110 is coupled to memory controller 120 through data connections 101. However, in some implementations computer system 110 includes memory controller 120 as a component and/or a sub-system. Computer system 110 may be any suitable computer device, such as a computer, a laptop computer, a tablet device, a netbook, an internet kiosk, a personal digital assistant, a mobile phone, a smart phone, a gaming device, a computer server, or any other computing device. Computer system 110 is sometimes called a host or host system. In some implementations, computer system 110 includes one or more processors, one or more types of memory, a display and/or other user interface components such as a keyboard, a touch screen display, a mouse, a trackpad, a digital camera and/or any number of supplemental devices to add functionality.

Storage medium 130 is coupled to memory controller 120 through connections 103. Connections 103 are sometimes called data connections, but typically convey commands in addition to data, and optionally convey metadata, error correction information and/or other information in addition to data values to be stored in storage medium 130 and data values read from storage medium 130. In some implementations, however, memory controller 120 and storage medium 130 are included in the same device as components thereof. Furthermore, in some implementations memory controller 120 and storage medium 130 are embedded in a host device, such as a mobile device, tablet, other computer or computer controlled device, and the methods described herein are performed by the embedded memory controller. Storage medium 130 may include any number (i.e., one or more) of memory devices including, without limitation, non-volatile semiconductor memory devices, such as flash memory. For example, flash memory devices can be configured for enterprise storage suitable for applications such as cloud computing, or for caching data stored (or to be stored) in secondary storage, such as hard disk drives. Additionally and/or alternatively, flash memory can also be configured for relatively smaller-scale applications such as personal flash drives or hard-disk replacements for personal, laptop and tablet computers.

Storage medium 130 is divided into a number of addressable and individually selectable blocks, such as selectable portion 131. In some implementations, the individually selectable blocks are the minimum size erasable units in a flash memory device. In other words, each block contains the minimum number of memory cells that can be erased simultaneously. Each block is usually further divided into a plurality of pages and/or word lines, where each page or word line is typically an instance of the smallest individually accessible (readable) portion in a block. In some implementations (e.g., using some types of flash memory), the smallest individually accessible unit of a data set, however, is a sector, which is a subunit of a page. That is, a block includes a plurality of pages, each page contains a plurality of sectors, and each sector is the minimum unit of data for reading data from the flash memory device.

For example, one block comprises any number of pages, for example, 64 pages, 128 pages, 256 pages or another suitable number of pages. Blocks are typically grouped into a plurality of zones. Each block zone can be independently managed to some extent, which increases the degree of parallelism for parallel operations and simplifies management of storage medium 130.

In some implementations, memory controller 120 includes a management module 121, a host interface 129, a storage medium interface (I/O) 128, and additional module(s) 125. Memory controller 120 may include various additional features that have not been illustrated for the sake of brevity and so as not to obscure more pertinent features of the example implementations disclosed herein, and a different arrangement of features may be possible. Host interface 129 provides an interface to computer system 110 through data connections 101. Similarly, storage medium I/O 128 provides an interface to storage medium 130 though connections 103. In some implementations, storage medium I/O 128 includes read and write circuitry, including circuitry capable of providing reading signals to storage medium 130 (e.g., reading threshold voltages for NAND-type flash memory).

In some implementations, management module 121 includes one or more processing units (CPUs, also sometimes called processors) 122 configured to execute instructions in one or more programs (e.g., in management module 121). In some implementations, the one or more CPUs 122 are shared by one or more components within, and in some cases, beyond the function of memory controller 120. Management module 121 is coupled to host interface 129, additional module(s) 125 and storage medium I/O 128 in order to coordinate the operation of these components.

Additional module(s) 125 are coupled to storage medium I/O 128, host interface 129, and management module 121. As an example, additional module(s) 125 may include an error control module to limit the number of uncorrectable errors inadvertently introduced into data during writes to memory or reads from memory. In some embodiments, additional module(s) 125 are executed in software by the one or more CPUs 122 of management module 121, and, in other embodiments, additional module(s) 125 are implemented in whole or in part using special purpose circuitry (e.g., to perform encoding and decoding functions).

During a write operation, host interface 129 receives data to be stored in storage medium 130 from computer system 110. The data held in host interface 129 is made available to an encoder (e.g., in additional module(s) 125), which encodes the data to produce one or more codewords. The one or more codewords are made available to storage medium I/O 128, which transfers the one or more codewords to storage medium 130 in a manner dependent on the type of storage medium being utilized.

A read operation is initiated when computer system (host) 110 sends one or more host read commands on control line 111 to memory controller 120 requesting data from storage medium 130. Memory controller 120 sends one or more read access commands to storage medium 130, via storage medium I/O 128, to obtain raw read data in accordance with memory locations (addresses) specified by the one or more host read commands. Storage medium I/O 128 provides the raw read data (e.g., comprising one or more codewords) to a decoder (e.g., in additional module(s) 125). If the decoding is successful, the decoded data is provided to host interface 129, where the decoded data is made available to computer system 110. In some implementations, if the decoding is not successful, memory controller 120 may resort to a number of remedial actions or provide an indication of an irresolvable error condition.

Flash memory devices utilize memory cells to store data as electrical values, such as electrical charges or voltages. Each flash memory cell typically includes a single transistor with a floating gate that is used to store a charge, which modifies the threshold voltage of the transistor (i.e., the voltage needed to turn the transistor on). The magnitude of the charge, and the corresponding threshold voltage the charge creates, is used to represent one or more data values. In some implementations, during a read operation, a reading threshold voltage is applied to the control gate of the transistor and the resulting sensed current or voltage is mapped to a data value.

The terms "cell voltage" and "memory cell voltage," in the context of flash memory cells, means the threshold voltage of the memory cell, which is the minimum voltage that needs to be applied to the gate of the memory cell's transistor in order for the transistor to conduct current. Similarly, reading threshold voltages (sometimes also called reading signals and reading voltages) applied to a flash memory cells are gate voltages applied to the gates of the flash memory cells to determine whether the memory cells conduct current at that gate voltage. In some implementations, when a flash memory cell's transistor conducts current at a given reading threshold voltage, indicating that the cell voltage is less than the reading threshold voltage, the raw data value for that read operation is a "1," and otherwise the raw data value is a "0."

As explained above, a storage medium (e.g., storage medium 130) is divided into a number of addressable and individually selectable blocks and each block is optionally (but typically) further divided into a plurality of pages and/or word lines and/or sectors. While erasure of a storage medium is performed on a block basis, in many embodiments, reading and programming of the storage medium is performed on a smaller subunit of a block (e.g., on a page basis, word line basis, or sector basis). In some embodiments, the smaller subunit of a block consists of multiple memory cells (e.g., single-level cells or multi-level cells). In some embodiments, programming is performed on an entire page.

As an example, if data is written to a storage medium in pages, but the storage medium is erased in blocks, pages in the storage medium may contain invalid (e.g., stale) data, but those pages cannot be overwritten until the whole block containing those pages is erased. In order to write to the pages with invalid data, the pages with valid data in that block are read and re-written to a new block and the old block is erased (or put on a queue for erasing). This process is called garbage collection. After garbage collection, the new block contains pages with valid data and free pages that are available for new data to be written, and the old block that was erased is also available for new data to be written. Since flash memory can only be programmed and erased a limited number of times, the efficiency of the algorithm used to pick the next block(s) to re-write and erase has a significant impact on the lifetime and reliability of flash-based storage systems.

Write amplification is a phenomenon where the actual amount of physical data written to a storage medium (e.g., storage medium 130) is a multiple of the logical amount of data intended to be written by a host (e.g., computer system 110, sometimes called a host). As discussed above, when a storage medium must be erased before it can be re-written, the garbage collection process to perform these operations results in re-writing data one or more times. This multiplying effect increases the number of writes required over the life of a storage medium, which shortens the time it can reliably operate. The formula to calculate the write amplification of a storage system is given by equation (1):

$$\frac{\text{amount of data written to a storage medium}}{\text{amount of data written by a host}} \quad (1)$$

Generally, garbage collection is performed on erase blocks with the fewest number of valid pages for best performance and best write amplification. However, since different erase blocks have different wear characteristics, it is important to use erase blocks based on how much life a respective erase block has left, rather than simply the number of program-erase cycles performed on the respective erase block thus far. As described below, in some implementations, garbage collection that is performed based on characteristics of erase blocks (e.g., an age metric) helps to improve wear leveling, thus extending the life of the memory device.

Figure 2A:
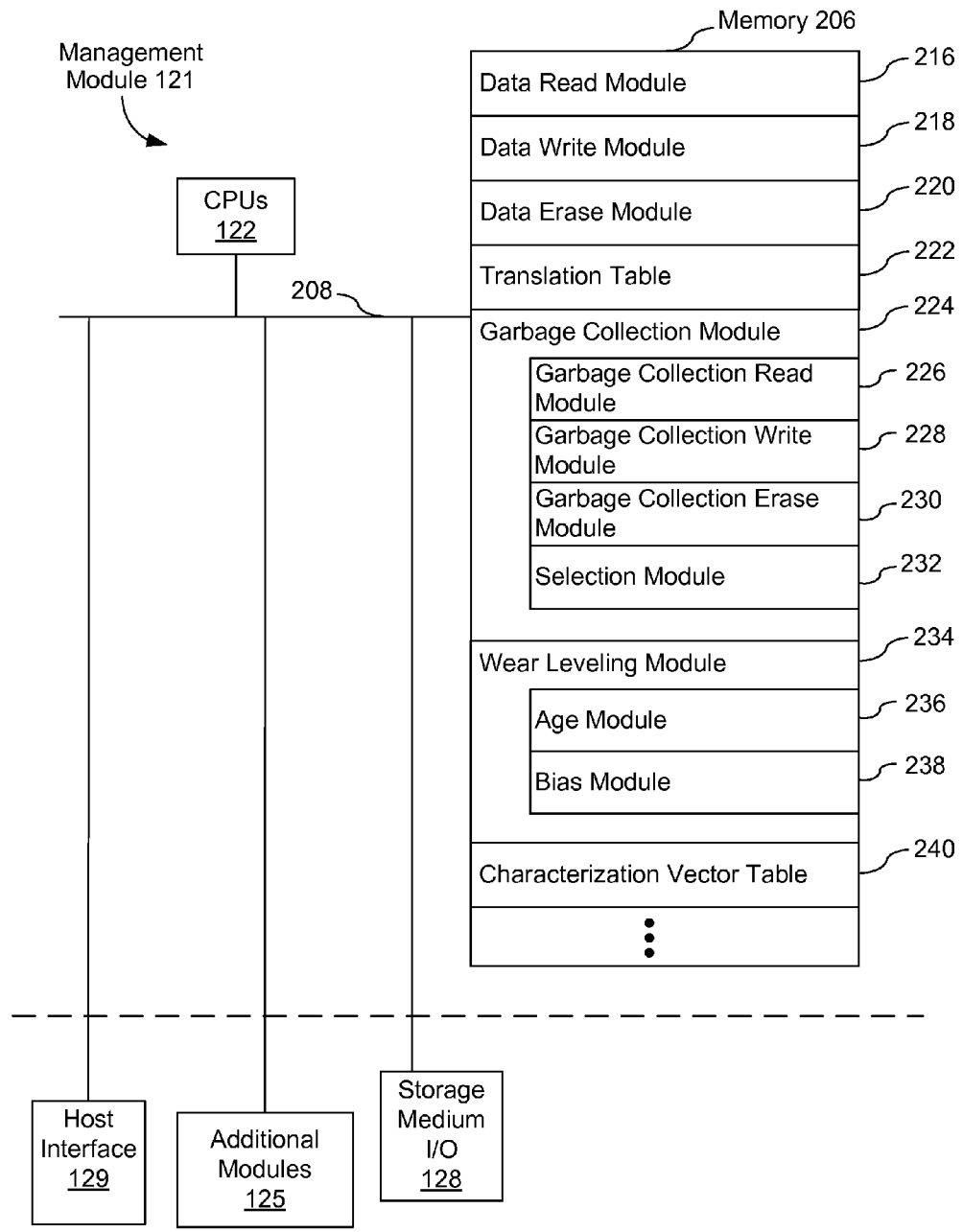
FIG. 2A is a block diagram illustrating an implementation of a management module, in accordance with some embodiments.

FIG. 2A is a block diagram illustrating an exemplary management module 121, in accordance with some embodiments. Management module 121 typically includes one or more processing units (CPUs) 122 for executing modules, programs and/or instructions stored in memory 206 and thereby performing processing operations, memory 206, and one or more communication buses 208 for interconnecting these components. Communication buses 208 optionally include circuitry (sometimes called a chipset) that interconnects and controls communications between system components. Management module 121 is coupled to host interface 129, additional module(s) 125, and storage medium I/O 128 by communication buses 208. Memory 206 includes high-speed random access memory, such as DRAM, SRAM, DDR RAM or other random access solid state memory devices, and may include non-volatile memory, such as one or more magnetic disk storage devices, optical disk storage devices, flash memory devices, or other non-volatile solid state storage devices. Memory 206 optionally includes one or more storage devices remotely located from the CPU(s) 122. Memory 206, or alternately the non-volatile memory device(s) within memory 206, comprises a non-transitory computer readable storage medium. In some embodiments, memory 206, or the computer readable storage medium of memory 206 stores the following programs, modules, and data structures, or a subset thereof:

- a data read module 216 that is used for reading data from one or more blocks in a storage medium;
- a data write module 218 that is used for writing data to one or more blocks in a storage medium;
- a data erase module 220 that is used for erasing data from one or more blocks in a storage medium;
- a translation table 222 that is used for mapping logical addresses to physical addresses;
- a garbage collection module 224 that is used for garbage collection for one or more blocks in a storage medium;
- a wear leveling module 234 that is used for wear leveling for a storage medium; and
- a characterization vector table 240 that includes a collection of characterization vectors (e.g., characterization vectors 242, FIG. 2B), each characterization vector storing characterization data for a respective portion of a storage medium (e.g., a flash memory device, die, block zone, block, word line, word line zone or page portion of storage medium 130, FIG. 1).

In some embodiments, the garbage collection module 224 optionally includes the following modules or sub-modules, or a subset thereof:

- a garbage collection read module 226 that is used for reading data from one or more blocks in a storage medium during a garbage collection operation;
- a garbage collection write module 228 that is used for writing data to one or more blocks in a storage medium during a garbage collection operation;
- a garbage collection erase module 230 that is used for erasing data from one or more blocks in a storage medium during a garbage collection operation; and
- a selection module 232 that is used for selecting one or more blocks (e.g., an erase unit) in a storage medium for garbage collection.

In some embodiments, the wear leveling module 234 optionally includes the following modules or sub-modules, or a subset thereof:

- an age module 236 that is used for determining an age metric for one or more erase units (e.g., one or more blocks) in a storage medium; and
- a bias module 238 that is used for biasing a garbage collection control metric (e.g., valid-page count).

Each of the above identified elements may be stored in one or more of the previously mentioned memory devices, and corresponds to a set of instructions for performing a function described above. The above identified modules or programs (i.e., sets of instructions) need not be implemented as separate software programs, procedures or modules, and thus various subsets of these modules may be combined or otherwise re-arranged in various embodiments. In some embodiments, memory 206 may store a subset of the modules and data structures identified above. Furthermore, memory 206 may store additional modules and data structures not described above. In some embodiments, the programs, modules, and data structures stored in memory 206, or the computer readable storage medium of memory 206, provide instructions for implementing any of the methods described below with reference to FIGS. 4A-4D.

Although FIG. 2A shows a management module 121, FIG. 2A is intended more as functional description of the various features which may be present in a management module than as a structural schematic of the embodiments described herein. In practice, and as recognized by those of ordinary skill in the art, items shown separately could be combined and some items could be separated.

Figure 2C:
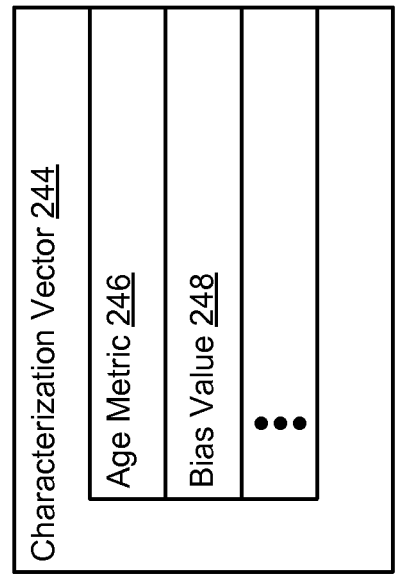
FIG. 2C is a block diagram illustrating an implementation of a characterization vector included in FIG. 2B, in accordance with some embodiments.
Figure 2B:
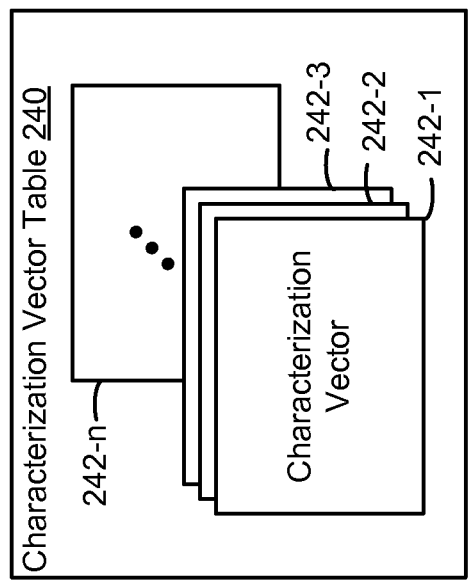
FIG. 2B is a block diagram illustrating an implementation of a characterization vector table included in FIG. 2A, in accordance with some embodiments.

FIG. 2B is a block diagram illustrating an implementation of a characterization vector table 240, in accordance with some embodiments. Characterization vector table 240 includes a collection of characterization vectors 242, that each store characterization data associated with a respective portion of a storage medium (e.g., a distinct device, die, block zone, block, word line, word line zone or page portion of storage medium 130, FIG. 1). In some embodiments, the characterization data stored in characterization vectors 242 is statistically derived. For example, without limitation, in some embodiments in which a storage medium (e.g., storage medium 130, FIG. 1) includes a plurality of erase units (e.g., one or more erase blocks), characterization vector table 240 includes at least one characterization vector for each erase unit. In another example, in some embodiments, characterization vector table 240 includes a set of distinct characterization vectors 242 for each erase unit in the storage medium (e.g., storage medium 130, FIG. 1), and the set of distinct characterization vectors 242 for each erase unit includes at least one distinct characterization vector for each block in the erase unit. In yet another example, in some embodiments in which a storage medium (e.g., storage medium 130, FIG. 1) includes a plurality of storage units and each storage unit includes a plurality of erase units, characterization vector table 240 includes at least one characterization vector for each storage unit. More detailed example embodiments of characterization vectors 242 are described below with reference to FIG. 2C.

FIG. 2C is a block diagram illustrating an implementation of a characterization vector 244 (e.g., corresponding to one of characterization vectors 242 shown in FIG. 2B) for a respective erase unit, in accordance with some embodiments. In some embodiments, characterization data stored in characterization vector 244 for the respective erase unit includes storage medium characterization parameter values such as an age metric field 246 indicating an age of the respective erase unit (e.g., a metric corresponding to estimated remaining life of the respective erase unit), and, optionally, a bias value field 248 indicating a bias value with which to adjust a garbage collection control metric for the respective erase unit. In some embodiments, the one or more storage medium characterization parameter values provide an indication of at least one of: a physical characteristic associated with the respective portion of the storage medium (e.g., a distinct flash memory device, die, block zone, block, word line, word line zone or page portion of storage medium 130, FIG. 1), a mode of operation associated with the respective portion of the storage medium, a history of use associated with the respective portion of the storage medium, a condition characteristic associated with the respective portion of the storage medium, a read type associated with the respective portion of the storage medium, and location(s) associated with the respective portion of the storage medium.

Figure 3:
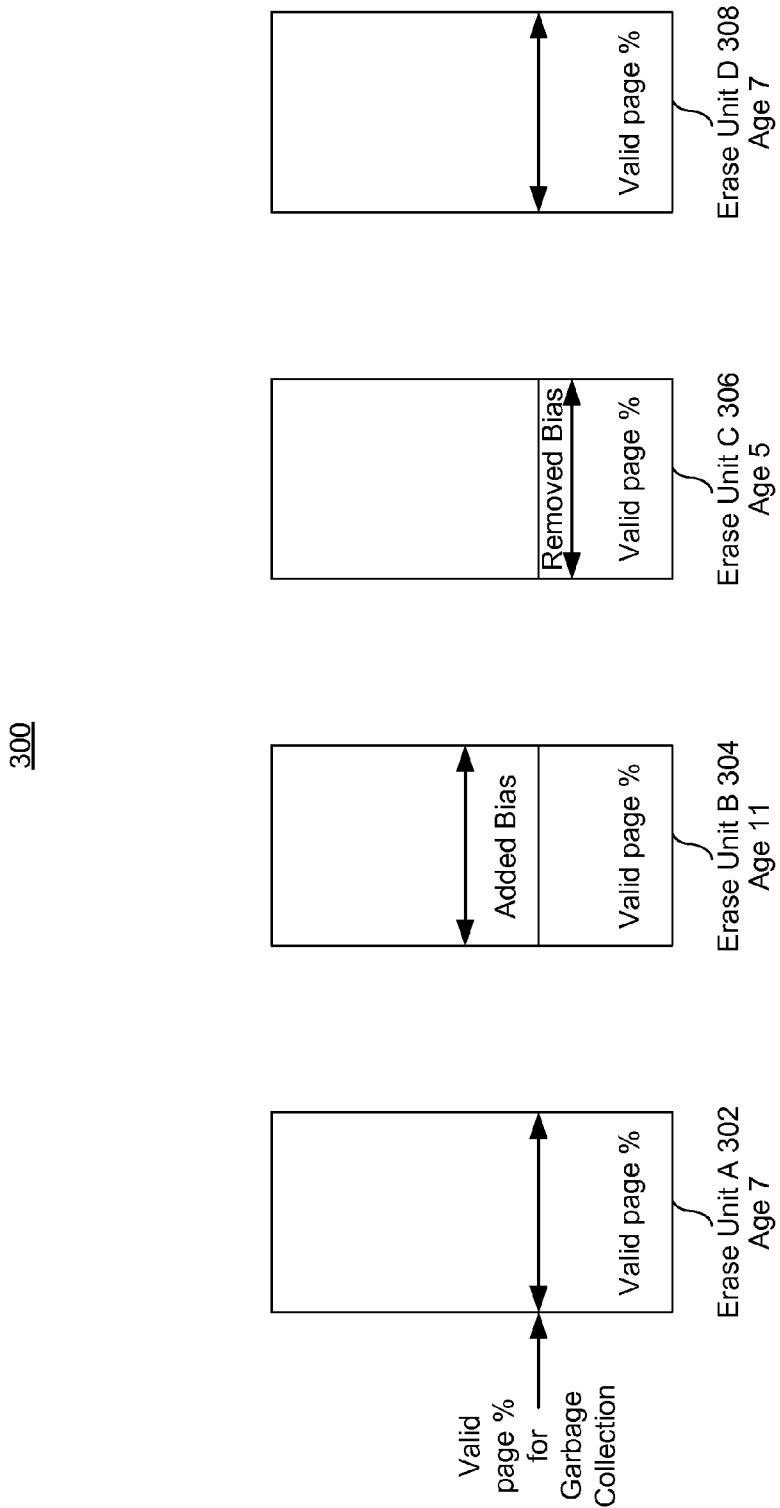
FIG. 3 is a block diagram of a plurality of erase units, in accordance with some embodiments.
Figure 4A:
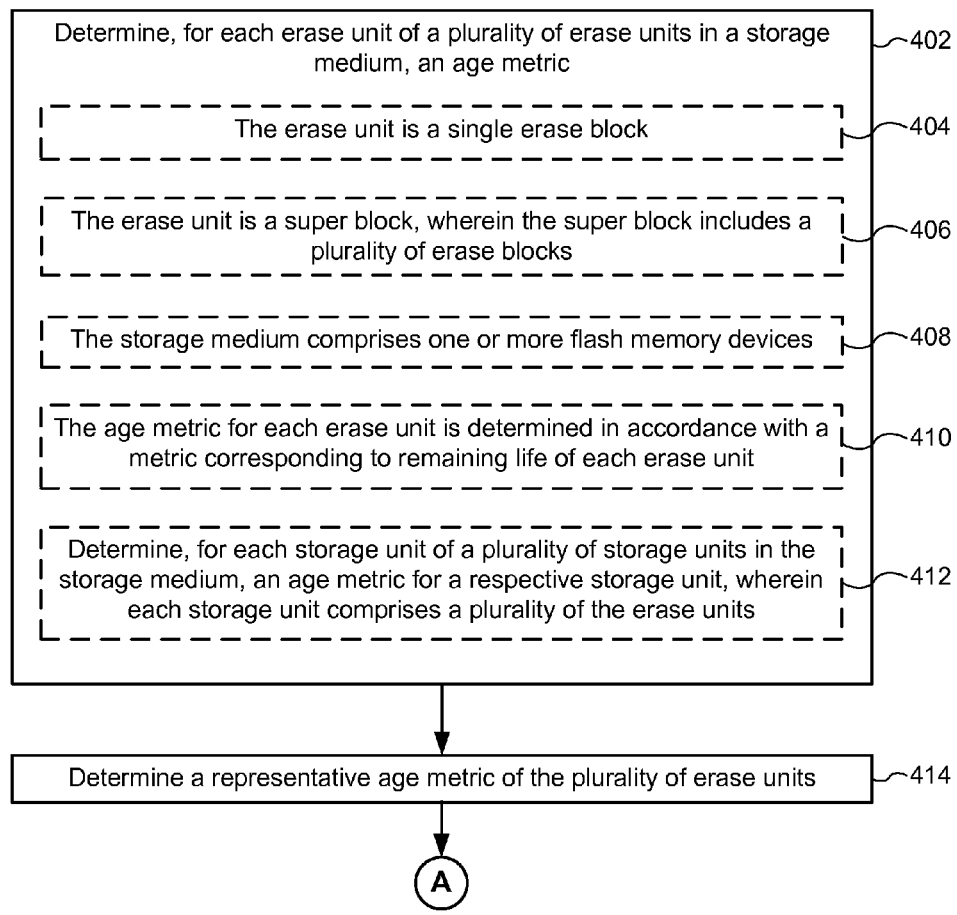
FIGS. 4A-4D illustrate a flowchart representation of a method of wear leveling for a storage medium, in accordance with some embodiments.
Figure 4B:
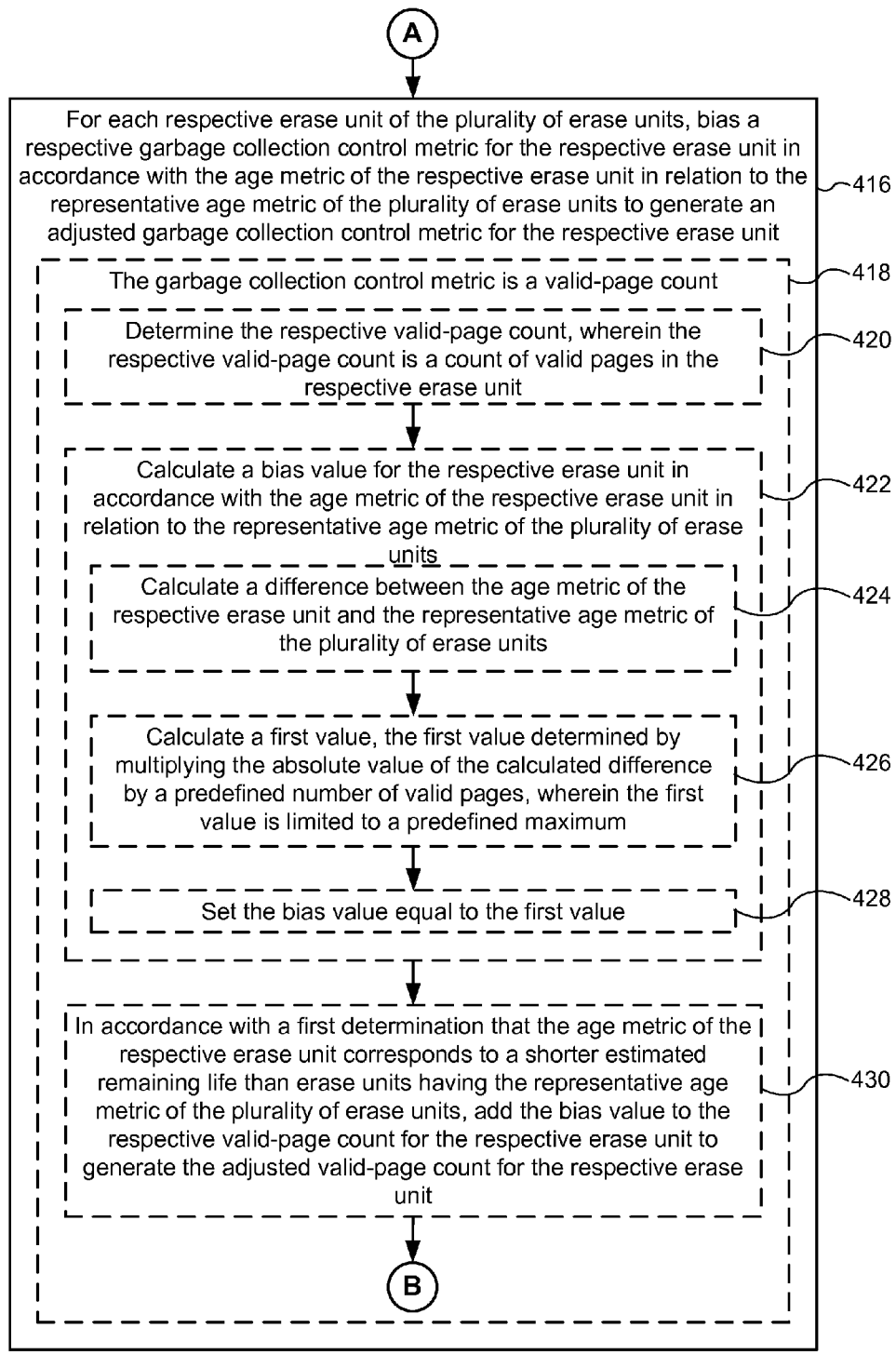
Figure 4C:
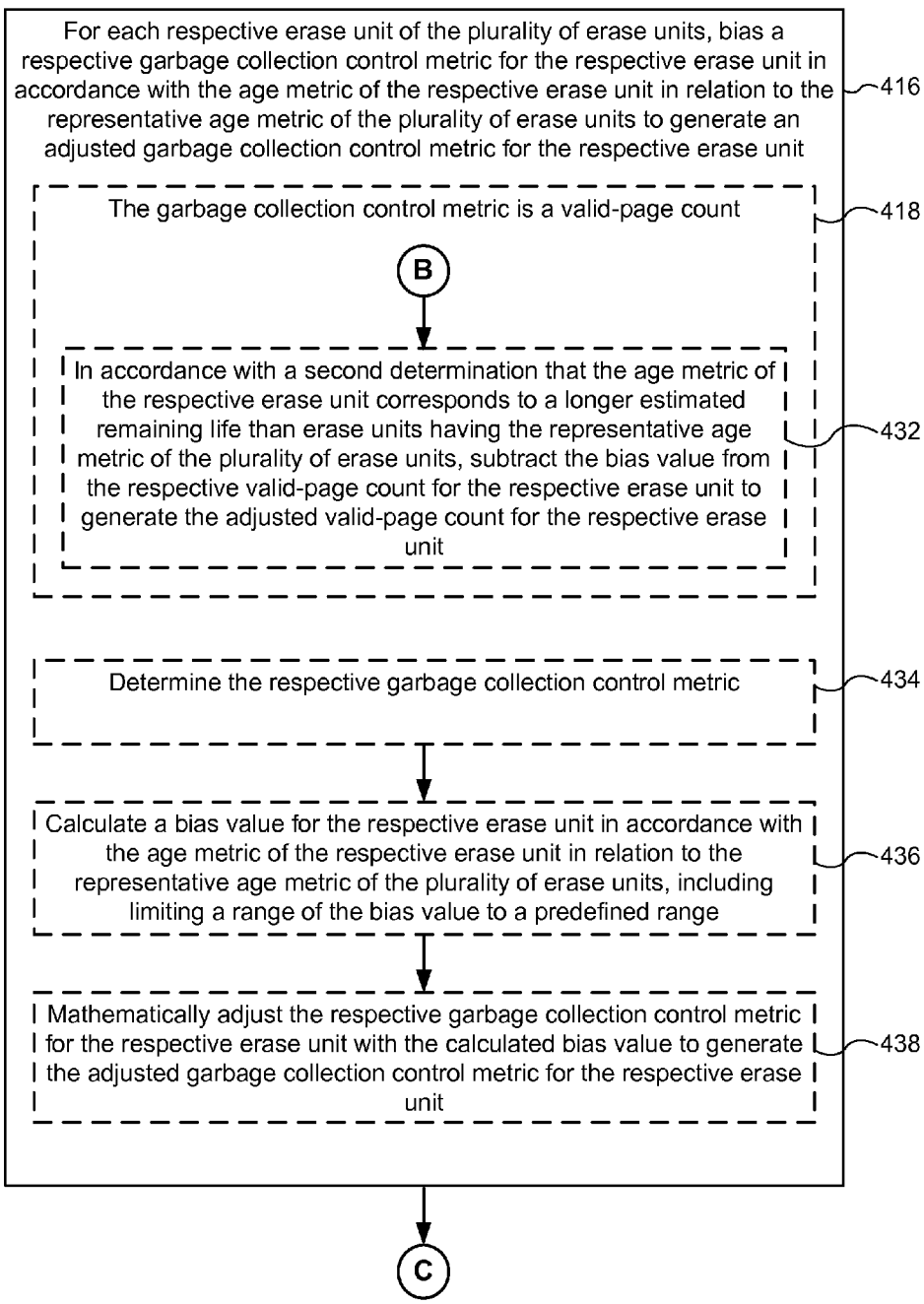
Figure 4D:
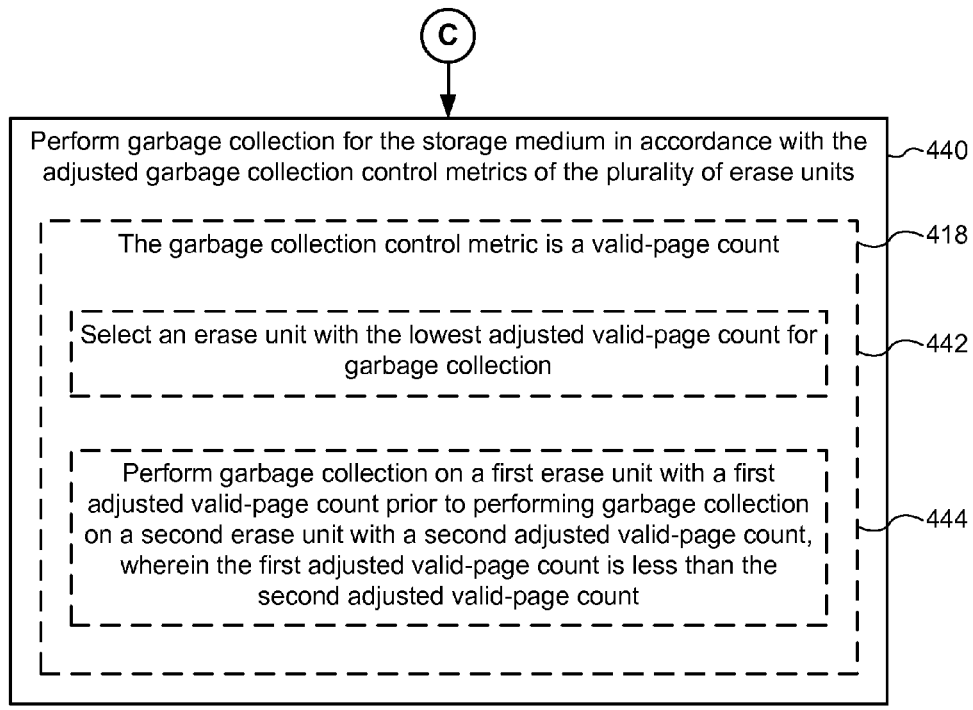

FIG. 3 is a block diagram of a plurality of erase units, in accordance with some embodiments. Since different erase units have different characteristics (e.g., some erase units can withstand more program-erase cycles than other erase units), it is important to use the different erase units accordingly (e.g., applying more program-erase cycles to "stronger" erase units and applying fewer program-erase cycles to "weaker" erase units). In some embodiments, in order to wear level erase units based on estimated remaining life of each erase unit, rather than simply the number of program-erase cycles performed on each erase unit, garbage collection is performed on the "stronger" or "younger" erase units more quickly than average and garbage collection is performed on the "weaker" or "older" erase units more slowly than average. In some implementations, a garbage collection control metric used for prioritizing garbage collection is a valid-page count. As described above, garbage collection is generally performed on erase units with the fewest number of valid pages for best performance and best write amplification. By biasing the valid-page counts for the erase units based on an age metric for a respective erase unit in relation to a representative age metric for the plurality of erase units in the storage medium, garbage collection can be prioritized accordingly.

In the embodiments described next, the age metric for each erase unit is inversely related to the estimated remaining life of the erase unit. Thus, weaker or older erase units are erase units having less estimated remaining life than the average erase units in the storage medium, and these weaker or older erase units have greater (i.e., higher) age metrics than erase units that have more estimated remaining life. Similarly, stronger or younger erase units are erase units having more estimated remaining life than the average erase units in the storage medium, and these stronger or younger erase units have lower age metrics than erase units that have less estimated remaining life.

In the example of FIG. 3, four erase units of a plurality of erase units in a storage medium (e.g., storage medium 130, FIG. 1) are shown: erase unit A 302 (age 7), erase unit B 304 (age 11), erase unit C 306 (age 5), and erase unit D 308 (age 7). In this example, the representative age of erase units in the storage medium is 7. In this example, the average age of erase units in the storage medium is 7, and the median age of erase units in the storage medium is 7. In some embodiments, the average age of erase units in the storage medium is different from the median age of erase units in the storage medium. Since erase unit B 304 is older than average (e.g., older than the representative age of 7), a bias (e.g., stored in bias value field 248, FIG. 2C) is added to the valid-page count for erase unit B 304 so it appears that erase unit B 304 has more valid pages, thus delaying garbage collection. Since erase unit C 306 is younger than average (e.g., younger than the representative age of 7), a bias (e.g., stored in bias value field 248, FIG. 2C) is subtracted from the valid-page count for erase unit C 306 so it appears that erase unit C 306 has fewer valid pages, thus expediting garbage collection. In some implementations, a predefined number of valid pages is added or subtracted for each age that the erase unit differs from the representative age of erase units in the storage medium, up to maximum bias limits imposed by firmware. The maximum bias limits ensure that the biasing for wear leveling does not increase write amplification more than what has been determined as acceptable.

For example, if the predefined number of valid pages is 256 pages, and erase unit B 304 (age 11) is 4 age units older than the representative age of 7, the bias added to the valid-page count for erase unit B 304 is 1,024 pages (i.e., 256 pages*4 age units). As another example, if the predefined number of valid pages is 256 pages, and erase unit C 306 (age 5) is 2 age units younger than the representative age of 7, the bias subtracted from the valid-page count for erase unit C 306 is 512 pages (i.e., 256 pages*2 age units). As yet another example, since erase unit A 302 (age 7) and erase unit D 308 (age 7) are the same age as the representative age of erase units in the storage medium, the valid-page counts for erase unit A 302 and erase unit D 308 are not biased for garbage collection purposes. In some implementations, if the maximum bias limit is, say, 6 times the predefined number of valid pages, even if an erase unit is 7 or more age units older or younger than the representative age, the bias added or subtracted from the valid-page count is limited to 6 times the predefined number of valid pages. For example, say erase unit E (not pictured) is age 14, which is 7 age units older than the representative age of 7, and the predefined number of valid pages is 256, the bias to be added to the valid-page count for erase unit E would be 1,792 pages. However, if the bias value is limited to a predefined maximum of 1,536 pages, only 1,536 pages would be added to the valid-page count for erase unit E.

Although valid-page count is used as an example for the description of FIG. 3, in other embodiments, other garbage collection control metrics are used to prioritize garbage collection and bias values are calculated and the garbage collection control metrics are adjusted accordingly. For example, in some implementations, a garbage collection control metric used for prioritizing garbage collection is an invalid-page count (e.g., a count of invalid or dirty or "freeable" pages) and bias values are subtracted from the invalid-page counts for "older" erase units and added to invalid-page counts for "younger" erase units.

FIGS. 4A-4D illustrate a flowchart representation of a method 400 of wear leveling for a storage medium in a storage system, in accordance with some embodiments. As noted above with respect to FIG. 1, since erasure of a storage medium is performed on a block basis, but in many embodiments, programming of the storage medium is performed on a smaller subunit of a block (e.g., on a page basis), pages with invalid data cannot be overwritten until the whole block containing those pages is erased. The storage system (e.g., data storage system 100, FIG. 1) uses garbage collection to reclaim portions of memory (e.g., storage medium 130, FIG. 1) that no longer contain valid data, which includes performance of method 400.

At least in some implementations, method 400 is performed by a storage system (e.g., data storage system 100, FIG. 1) or one or more components of the storage system (e.g., memory controller 120 and/or storage medium 130, FIG. 1). In some embodiments, method 400 is governed by instructions that are stored in a non-transitory computer readable storage medium and that are executed by one or more processors of a device, such as the one or more processing units (CPUs) 122 of management module 121, shown in FIGS. 1 and 2A.

A storage system (e.g., data storage system 100, FIG. 1) determines (402), for each erase unit of a plurality of erase units in a storage medium (e.g., storage medium 130, FIG. 1), an age metric. In some implementations, an age module (e.g., age module 236, FIG. 2A) is used to determine, for each erase unit of a plurality of erase units in a storage medium, an age metric, as described above with respect to FIG. 2A.

In some embodiments, the erase unit is (404) a single erase block. For example, for a flash memory device, the erase unit is a single erase block, the minimum size erasable unit in a flash memory device.

In some embodiments, the erase unit is (406) a super block, wherein the super block includes a plurality of erase blocks. For example, in some implementations, a super block includes 16 erase blocks.

In some embodiments, the storage medium comprises (408) one or more non-volatile storage devices, such as flash memory devices. In some implementations, the non-volatile storage medium (e.g., storage medium 130, FIG. 1) is a single flash memory device, while in other implementations the non-volatile storage medium includes a plurality of flash memory devices. In some implementations, the non-volatile storage medium (e.g., storage medium 130, FIG. 1) is NAND-type flash memory or NOR-type flash memory.

In some embodiments, the age metric for each erase unit is (410) determined in accordance with a metric corresponding to estimated remaining life of each erase unit. In some embodiments, some erase units can withstand more program-erase cycles than other erase units, and the age metric for each erase unit is determined in accordance with a metric corresponding to estimated remaining life of each erase unit (as opposed to simply the number of program-erase cycles completed for each erase unit). For example, if an erase unit can withstand more program-erase cycles than the average erase unit (e.g., with an age equal to the representative age metric of the plurality of erase units), then that erase unit has more estimated remaining life and is considered "younger" than the average erase unit. As another example, if an erase unit can withstand less program-erase cycles than the average erase unit, then that erase unit has less estimated remaining life and is considered "older" than the average erase unit. In some embodiments, the age metric is determined periodically (e.g., an updated age metric for an erase unit is determined every 100 program-erase cycles of the erase unit).

In some embodiments, determining (402), for each erase unit of a plurality of erase units in the storage medium, the age metric comprises determining (412), for each storage unit of a plurality of storage units in the storage medium, an age metric for a respective storage unit, wherein each storage unit comprises a plurality of the erase units. In some embodiments, the age metric for an erase unit comprises the age metric determined for the corresponding storage unit. In some implementations, the age metric for the storage unit is the worst (e.g., "oldest") age metric for any of the erase units in the storage unit. In some implementations, the age metric for the storage unit is the average age metric of the erase units in the storage unit. In some implementations, the age metric for the storage unit is the median age metric of the erase units in the storage unit. In some implementations, an age module (e.g., age module 236, FIG. 2A) is used to determine, for each storage unit of a plurality of storage units in the storage medium, an age metric for a respective storage unit, wherein each storage unit comprises a plurality of the erase units, as described above with respect to FIG. 2A.

Next, the storage system determines (414) a representative age metric of the plurality of erase units. In some embodiments, the representative age metric of the plurality of erase units is an average age metric of the plurality of erase units. In some embodiments, the representative age metric of the plurality of erase units is a median age metric of the plurality of erase units. For example, if a storage medium (e.g., storage medium 130, FIG. 1) includes 4 erase units with ages of 5, 7, 7, and 9, respectively, and the representative age metric of the plurality of erase units is an average age metric of the plurality of erase units, the storage system determines the average age metric of the plurality of erase units to be 7 (i.e., (5+7+7+9)/4). In some embodiments, the representative age metric of the plurality of erase units is determined periodically. For example, in some implementations, the storage system accumulates N age metric measurements, where N is a predetermined number (e.g., N is equal to 2048), and then divides the accumulated total by N, once N age metric measurements have been accumulated. In some implementations, an age module (e.g., age module 236, FIG. 2A) is used to determine a representative age metric of the plurality of erase units, as described above with respect to FIG. 2A.

Next, the storage system, for each respective erase unit of the plurality of erase units, biases (416) a respective garbage collection control metric for the respective erase unit in accordance with the age metric of the respective erase unit in relation to the representative age metric of the plurality of erase units to generate an adjusted garbage collection control metric for the respective erase unit. In some implementations, a bias module (e.g., bias module 238, FIG. 2A) is used to bias, for each respective erase unit of the plurality of erase units, a respective garbage collection control metric for the respective erase unit in accordance with the age metric of the respective erase unit in relation to the representative age metric of the plurality of erase units to generate an adjusted garbage collection control metric for the respective erase unit, as described above with respect to FIG. 2A.

In some embodiments, the garbage collection control metric is (418) a valid-page count and biasing the respective valid-page count for the respective erase unit includes determining (420) the respective valid-page count, wherein the respective valid-page count is a count of valid pages in the respective erase unit. For example, if an erase unit has 10,240 pages, 2,500 of which are valid and 7,740 of which are invalid, the valid-page count is 2,500. In some implementations, a respective valid-page count is updated when data on the respective erase unit is written to another location (e.g., the host system rewrote the logical location for that data), since at that time, the respective erase unit has an invalid (e.g., stale) version of that data. In some implementations, the valid-page count is tracked loosely while in other implementations, the valid-page count is tracked precisely. In some implementations, a bias module (e.g., bias module 238, FIG. 2A) is used to determine the respective valid-page count, wherein the respective valid-page count is a count of valid pages in the respective erase unit, as described above with respect to FIG. 2A.

Next, biasing the respective valid-page count for the respective erase unit includes calculating (422) a bias value for the respective erase unit in accordance with the age metric of the respective erase unit in relation to the representative age metric of the plurality of erase units. For example, if a first erase unit (e.g., erase unit B 304, FIG. 3) is 4 age units older than the representative age metric of the plurality of erase units, the bias value for the first erase unit will be greater than the bias value for a second erase unit that is 2 age units older than the representative age metric. In some implementations, a bias module (e.g., bias module 238, FIG. 2A) is used to calculate a bias value for the respective erase unit in accordance with the age metric of the respective erase unit in relation to the representative age metric of the plurality of erase units, as described above with respect to FIG. 2A.

In some embodiments, calculating (422) the bias value for the respective erase unit includes calculating (424) a difference between the age metric of the respective erase unit and the representative age metric of the plurality of erase units. For example, if the age metric of the respective erase unit is age 5 and the representative age metric of the plurality of erase units is age 7, the difference between the age metric of the respective erase unit and the representative age metric is 2 age units. In some implementations, a bias module (e.g., bias module 238, FIG. 2A) is used to calculate a difference between the age metric of the respective erase unit and the representative age metric of the plurality of erase units, as described above with respect to FIG. 2A.

Next, calculating (422) the bias value for the respective erase unit includes calculating (426) a first value, the first value determined by multiplying the absolute value of the calculated difference by a predefined number of valid pages, wherein the first value is limited to a predefined maximum. For example, if the calculated difference is 2 age units and the predefined number of valid pages is 256 pages, the first value is 512 pages (i.e., 2*256 pages), assuming the predefined maximum is greater than 512 pages. As another example, if the predefined maximum is 1,280 pages and the calculated difference is 8 age units and the predefined number of valid pages is 256 pages, the first value would have been 2,048 pages (i.e., 8*256 pages), but since the predefined maximum is 1,280 pages, the first value is limited to 1,280 pages. In some implementations, a bias module (e.g., bias module 238, FIG. 2A) is used to calculate a first value, the first value determined by multiplying the absolute value of the calculated difference by a predefined number of valid pages, wherein the first value is limited to a predefined maximum, as described above with respect to FIG. 2A.

Next, calculating (422) the bias value for the respective erase unit includes setting (428) the bias value equal to the first value. For example, if the first value is calculated to be 512 pages, the bias value is set to be 512 pages. In some implementations, a bias module (e.g., bias module 238, FIG. 2A) is used to set the bias value equal to the first value, as described above with respect to FIG. 2A.

After calculating (422) the bias value for the respective erase unit, the storage system, in accordance with a first determination that the age metric of the respective erase unit corresponds to a shorter estimated remaining life than erase units having the representative age metric of the plurality of erase units, adds (430) the bias value to the respective valid-page count for the respective erase unit to generate the adjusted valid-page count for the respective erase unit. As explained above, an erase unit with an age metric greater than the representative age metric is weaker, or has a shorter estimated remaining life, than an erase unit with an age metric equal to the representative age metric. For example, if the age metric of the respective erase unit is greater than the representative age metric of the plurality of erase units (e.g., the age metric of the respective erase unit is age 9 and the representative age metric is age 7) and the respective erase unit has a valid-page count of 2,500 pages and the bias value was calculated to be 512 pages, the storage system adds 512 pages to 2,500 pages to generate the adjusted valid-page count of 3,012 pages. In some implementations, a bias module (e.g., bias module 238, FIG. 2A) is used to add, in accordance with a first determination, the first determination including a determination that the age metric of the respective erase unit is greater than the representative age metric of the plurality of erase units, the bias value to the respective valid-page count for the respective erase unit to generate the adjusted valid-page count for the respective erase unit, as described above with respect to FIG. 2A.

Further, after calculating (422) the bias value for the respective erase unit, the storage system, in accordance with a second determination that the age metric of the respective erase unit corresponds to a longer estimated remaining life than erase units having the representative age metric of the plurality of erase units, subtracts (432) the bias value from the respective valid-page count for the respective erase unit to generate the adjusted valid-page count for the respective erase unit. For example, if the age metric of the respective erase unit is less than the representative age metric of the plurality of erase units (e.g., the age metric of the respective erase unit is age 5 and the representative age metric is age 7) and the respective erase unit has a valid-page count of 2,500 pages and the bias value was calculated to be 512 pages, the storage system subtracts 512 pages from 2,500 pages to generate the adjusted valid-page count of 1,988 pages. In some implementations, a bias module (e.g., bias module 238, FIG. 2A) is used to subtract, in accordance with a second determination, the second determination including a determination that the age metric of the respective erase unit is less than the representative age metric of the plurality of erase units, the bias value from the respective valid-page count for the respective erase unit to generate the adjusted valid-page count for the respective erase unit, as described above with respect to FIG. 2A.

In some embodiments, biasing (416) the respective garbage collection control metric for the respective erase unit includes determining (434) the respective garbage collection control metric. Optionally, the respective garbage collection control metric is a count of a metric for prioritizing garbage collection in the respective erase unit. In some embodiments, the garbage collection control metric is a valid-page count and determining the respective garbage collection control metric includes determining the respective valid-page count, wherein the respective valid-page count is a count of valid pages in the respective erase unit. In other embodiments, the garbage collection control metric is an invalid-page count and determining the respective garbage collection control metric includes determining the respective invalid-page count, wherein the respective invalid-page count is a count of invalid (e.g., dirty or "freeable") pages in the respective erase unit. In yet other embodiments, the garbage collection control metric is a count of some other metric for prioritizing garbage collection. In some implementations, a bias module (e.g., bias module 238, FIG. 2A) is used to determine the respective garbage collection control metric, as described above with respect to FIG. 2A.

Next, biasing (416) the respective garbage collection control metric for the respective erase unit includes calculating (436) a bias value for the respective erase unit in accordance with the age metric of the respective erase unit in relation to the representative age metric of the plurality of erase units, including limiting a range of the bias value to a predefined range. For example, if a first erase unit (e.g., erase unit B 304, FIG. 3) is 4 age units older than the representative age metric of the plurality of erase units, the bias value for the first erase unit will be greater than the bias value for a second erase unit that is 2 age units older than the representative age metric. In some implementations, a bias module (e.g., bias module 238, FIG. 2A) is used to calculate a bias value for the respective erase unit in accordance with the age metric of the respective erase unit in relation to the representative age metric of the plurality of erase units, including limiting a range of the bias value to a predefined range, as described above with respect to FIG. 2A.

Next, biasing (416) the respective garbage collection control metric for the respective erase unit includes mathematically adjusting (438) the respective garbage collection control metric for the respective erase unit with the calculated bias value to generate the adjusted garbage collection control metric for the respective erase unit. For example, if the garbage collection control metric is a valid-page count, the storage system mathematically adjusts the respective garbage collection control metric by adding or subtracting the calculated bias value as described in operations 430 and 432. As another example, if the garbage collection control metric is an invalid-page count, the storage system mathematically adjusts the respective garbage collection control metric by subtracting the calculated bias values for "older" erase units and adding the calculated bias values for "younger" erase units. In some implementations, a bias module (e.g., bias module 238, FIG. 2A) is used to mathematically adjust the respective garbage collection control metric for the respective erase unit with the calculated bias value to generate the adjusted garbage collection control metric for the respective erase unit, as described above with respect to FIG. 2A.

After biasing (416), for each respective erase unit of the plurality of erase units, a respective garbage collection control metric for the respective erase unit to generate an adjusted garbage collection control metric for the respective erase unit, the storage system performs (440) garbage collection for the storage medium in accordance with the adjusted garbage collection control metrics of the plurality of erase units. For example, in some embodiments (e.g., in which the garbage collection control metric is a valid-page count), the storage system performs garbage collection, giving priority to the erase units with the lowest adjusted garbage collection control metric. As another example, in some embodiments (e.g., in which the garbage collection control metric is an invalid-page count), the storage system performs garbage collection, giving priority to the erase units with the highest adjusted garbage collection control metric. In some implementations, a garbage collection module (e.g., garbage collection module 224, FIG. 2A) is used to perform garbage collection for the storage medium in accordance with the adjusted garbage collection control metrics of the plurality of erase units, as described above with respect to FIG. 2A.

In some embodiments, the garbage collection control metric is (418) a valid-page count and performing (440) garbage collection for the storage medium in accordance with the adjusted garbage collection control metrics of the plurality of erase units includes selecting (442) an erase unit with the lowest adjusted valid-page count for garbage collection. As described above, in other embodiments, the garbage collection control metric is an invalid-page count and performing garbage collection for the storage medium in accordance with the adjusted garbage collection control metrics of the plurality of erase units includes selecting an erase unit with the highest adjusted invalid-page count for garbage collection. In some implementations, a selection module (e.g., selection module 232, FIG. 2A) is used to select an erase unit with the lowest adjusted valid-page count for garbage collection, as described above with respect to FIG. 2A.

In some embodiments, garbage collection control metric is (418) a valid-page count and performing (440) garbage collection for the storage medium in accordance with the adjusted garbage collection control metrics of the plurality of erase units includes performing (444) garbage collection on a first erase unit with a first adjusted valid-page count prior to performing garbage collection on a second erase unit with a second adjusted valid-page count, wherein the first adjusted valid-page count is less than the second adjusted valid-page count. For example, if a first erase unit has a first adjusted valid-page count of 280 pages and a second erase unit has a second adjusted valid-page count of 500 pages, the storage system performs garbage collection on the first erase unit (with a first adjusted valid-page count of 280) prior to performing garbage collection on the second erase unit (with a second adjusted valid-page count of 500 pages). In some implementations, a garbage collection module (e.g., garbage collection module 224, FIG. 2A) is used to perform garbage collection on a first erase unit with a first adjusted valid-page count prior to performing garbage collection on a second erase unit with a second adjusted valid-page count, wherein the first adjusted valid-page count is less than the second adjusted valid-page count, as described above with respect to FIG. 2A.

In some implementations, with respect to any of the methods described above, the storage medium is a single flash memory device, while in other implementations, the storage medium includes a plurality of flash memory devices.

In some implementations, any of the methods described above are performed by a device operable to perform wear leveling for a storage medium, the device including (1) a storage medium interface for coupling the device to the storage medium, and (2) one or more modules, including a memory management module that includes one or more processors and memory storing one or more programs configured for execution by the one or more processors, the one or more modules coupled to the storage medium interface and configured to perform or control performance of any of the methods described above.

It will be understood that, although the terms "first," "second," etc. may be used herein to describe various elements, these elements should not be limited by these terms. These terms are only used to distinguish one element from another. For example, a first contact could be termed a second contact, and, similarly, a second contact could be termed a first contact, which changing the meaning of the description, so long as all occurrences of the "first contact" are renamed consistently and all occurrences of the second contact are renamed consistently. The first contact and the second contact are both contacts, but they are not the same contact.

The terminology used herein is for the purpose of describing particular embodiments only and is not intended to be limiting of the claims. As used in the description of the embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined [that a stated condition precedent is true]" or "if [a stated condition precedent is true]" or "when [a stated condition precedent is true]" may be construed to mean "upon determining" or "in response to determining" or "in accordance with a determination" or "upon detecting" or "in response to detecting" that the stated condition precedent is true, depending on the context.

The foregoing description, for purpose of explanation, has been described with reference to specific implementations. However, the illustrative discussions above are not intended to be exhaustive or to limit the claims to the precise forms disclosed. Many modifications and variations are possible in view of the above teachings. The implementations were chosen and described in order to best explain principles of operation and practical applications, to thereby enable others skilled in the art.

What is claimed is:

1. A method of wear leveling for a storage medium in a storage system, the method comprising:
   determining, for each erase unit of a plurality of erase units in the storage medium, an age metric;
   determining a representative age metric of the plurality of erase units;
   for each respective erase unit of the plurality of erase units, biasing a respective garbage collection control metric for the respective erase unit in accordance with the age metric of the respective erase unit in relation to the representative age metric of the plurality of erase units to generate an adjusted garbage collection control metric for the respective erase unit, wherein biasing the respective garbage collection control metric includes:
      calculating a difference between the age metric of the respective erase unit and the representative age metric of the plurality of erase units,
      calculating a first value, the first value determined by multiplying the absolute value of the calculated difference by a predefined number of valid pages, and
      biasing the respective garbage collection control metric by the calculated first value; and
   performing garbage collection for the storage medium in accordance with the adjusted garbage collection control metrics of the plurality of erase units.

2. The method of claim 1, wherein the garbage collection control metric is a valid-page count, and wherein biasing the respective valid-page count for the respective erase unit includes:
   determining the respective valid-page count, wherein the respective valid-page count is a count of valid pages in the respective erase unit;
   calculating a bias value for the respective erase unit in accordance with the age metric of the respective erase unit in relation to the representative age metric of the plurality of erase units;
   in accordance with a first determination that the age metric of the respective erase unit corresponds to a shorter estimated remaining life than erase units having the representative age metric of the plurality of erase units, adding the bias value to the respective valid-page count for the respective erase unit to generate the adjusted valid-page count for the respective erase unit; and
   in accordance with a second determination that the age metric of the respective erase unit corresponds to a longer estimated remaining life than erase units having the representative age metric of the plurality of erase units, subtracting the bias value from the respective valid-page count for the respective erase unit to generate the adjusted valid-page count for the respective erase unit.

3. The method of claim 1, wherein:
   the calculated first value is limited to a predefined maximum; and
   the garbage collection control metric for the respective erase unit is biased by the limited first value.

4. The method of claim 2, wherein performing garbage collection for the storage medium includes selecting an erase unit with a lowest adjusted valid-page count for garbage collection.

5. The method of claim 2, wherein performing garbage collection for the storage medium includes performing garbage collection on a first erase unit with a first adjusted valid-page count prior to performing garbage collection on a second erase unit with a second adjusted valid-page count, wherein the first adjusted valid-page count is less than the second adjusted valid-page count.

6. The method of claim 1, wherein biasing the respective garbage collection control metric for the respective erase unit includes:
 determining the respective garbage collection control metric;
 calculating a bias value for the respective erase unit in accordance with the age metric of the respective erase unit in relation to the representative age metric of the plurality of erase units, including limiting a range of the bias value to a predefined range; and
 mathematically adjusting the respective garbage collection control metric for the respective erase unit with the calculated bias value to generate the adjusted garbage collection control metric for the respective erase unit.

7. The method of claim 1, wherein the age metric for each erase unit is determined in accordance with a metric corresponding to estimated remaining life of each erase unit.

8. The method of claim 1, wherein the erase unit is a single erase block.

9. The method of claim 1, wherein the erase unit is a super block, wherein the super block includes a plurality of erase blocks.

10. The method of claim 1, wherein the storage medium comprises one or more flash memory devices.

11. The method of claim 1, wherein determining, for each erase unit of a plurality of erase units in the storage medium, the age metric comprises determining, for each storage unit of a plurality of storage units in the storage medium, an age metric for a respective storage unit, wherein each storage unit comprises a plurality of the erase units.

12. A device operable to perform wear leveling for a storage medium, the device comprising:
 a storage medium interface for coupling the device to the storage medium; and
 one or more modules, including a memory management module that includes one or more processors and memory storing one or more programs configured for execution by the one or more processors, the one or more modules coupled to the storage medium interface and configured to:
  determine, for each erase unit of a plurality of erase units in the storage medium, an age metric;
  determine a representative age metric of the plurality of erase units;
  bias, for each respective erase unit of the plurality of erase units, a respective garbage collection control metric for the respective erase unit in accordance with the age metric of the respective erase unit in relation to the representative age metric of the plurality of erase units to generate an adjusted garbage collection control metric for the respective erase unit, wherein biasing the respective garbage collection control metric includes:
   calculating a difference between the age metric of the respective erase unit and the representative age metric of the plurality of erase units,
   calculating a first value, the first value determined by multiplying the absolute value of the calculated difference by a predefined number of valid pages, and
   biasing the respective garbage collection control metric by the calculated first value; and
  perform garbage collection for the storage medium in accordance with the adjusted garbage collection control metrics of the plurality of erase units.

13. The device of claim 12, wherein the garbage collection control metric is a valid-page count, and wherein the one or more modules are configured to bias the respective valid-page count for the respective erase unit, including:
 determining the respective valid-page count, wherein the respective valid-page count is a count of valid pages in the respective erase unit;
 calculating a bias value for the respective erase unit in accordance with the age metric of the respective erase unit in relation to the representative age metric of the plurality of erase units;
 in accordance with a first determination that the age metric of the respective erase unit corresponds to a shorter estimated remaining life than erase units having the representative age metric of the plurality of erase units, adding the bias value to the respective valid-page count for the respective erase unit to generate the adjusted valid-page count for the respective erase unit; and
 in accordance with a second determination that the age metric of the respective erase unit corresponds to a longer estimated remaining life than erase units having the representative age metric of the plurality of erase units, subtracting the bias value from the respective valid-page count for the respective erase unit to generate the adjusted valid-page count for the respective erase unit.

14. The device of claim 12, wherein:
 the calculated first value is limited to a predefined maximum; and
 the garbage collection control metric for the respective erase unit is biased by the limited first value.

15. The device of claim 13, wherein the one or more modules are configured to perform garbage collection for the storage medium, including performing garbage collection on a first erase unit with a first adjusted valid-page count prior to performing garbage collection on a second erase unit with a second adjusted valid-page count, wherein the first adjusted valid-page count is less than the second adjusted valid-page count.

16. The device of claim 12, wherein the one or more modules are configured to bias the respective garbage collection control metric for the respective erase unit, including:
 determining the respective garbage collection control metric;
 calculating a bias value for the respective erase unit in accordance with the age metric of the respective erase unit in relation to the representative age metric of the plurality of erase units, including limiting a range of the bias value to a predefined range; and
 mathematically adjusting the respective garbage collection control metric for the respective erase unit with the calculated bias value to generate the adjusted garbage collection control metric for the respective erase unit.

17. The device of claim 12, wherein the age metric for each erase unit is determined in accordance with a metric corresponding to estimated remaining life of each erase unit.

18. The device of claim 12, wherein the storage medium comprises one or more flash memory devices.

19. A storage system, comprising:
 a storage medium;
 one or more processors; and memory storing one or more programs, which when executed by the one or more processors cause the storage system to:
- determine, for each erase unit of a plurality of erase units in the storage medium, an age metric;
- determine a representative age metric of the plurality of erase units;
- bias, for each respective erase unit of the plurality of erase units, a respective garbage collection control metric for the respective erase unit in accordance with the age metric of the respective erase unit in relation to the representative age metric of the plurality of erase units to generate an adjusted garbage collection control metric for the respective erase unit, wherein biasing the respective garbage collection control metric includes:
- calculating a difference between the age metric of the respective erase unit and the representative age metric of the plurality of erase units,
- calculating a first value, the first value determined by multiplying the absolute value of the calculated difference by a predefined number of valid pages, and
- biasing the respective garbage collection control metric by the calculated first value; and
- perform garbage collection for the storage medium in accordance with the adjusted garbage collection control metrics of the plurality of erase units.

20. A non-transitory computer readable storage medium storing one or more programs configured for execution by a device coupled to a storage medium, the one or more programs comprising instructions for:
- determining, for each erase unit of a plurality of erase units in the storage medium, an age metric;
- determining a representative age metric of the plurality of erase units;
- for each respective erase unit of the plurality of erase units, biasing a respective garbage collection control metric for the respective erase unit in accordance with the age metric of the respective erase unit in relation to the representative age metric of the plurality of erase units to generate an adjusted garbage collection control metric for the respective erase unit, wherein biasing the respective garbage collection control metric includes:
  - calculating a difference between the age metric of the respective erase unit and the representative age metric of the plurality of erase units,
  - calculating a first value, the first value determined by multiplying the absolute value of the calculated difference by a predefined number of valid pages, and
  - biasing the respective garbage collection control metric by the calculated first value; and
- performing garbage collection for the storage medium in accordance with the adjusted garbage collection control metrics of the plurality of erase units.

* * * * *